United States Patent
Sugimura

(10) Patent No.: US 8,930,159 B2
(45) Date of Patent: Jan. 6, 2015

(54) SEMICONDUCTOR CIRCUIT, SEMICONDUCTOR DEVICE, LINE BREAK DETECTION METHOD, AND COMPUTER READABLE MEDIUM STORING LINE BREAK DETECTION PROGRAM

(75) Inventor: Naoaki Sugimura, Tokyo (JP)

(73) Assignee: Lapis Semiconductor Co., Ltd., Yokohama (JP)

( * ) Notice: Subject to any disclaimer, the term of this patent is extended or adjusted under 35 U.S.C. 154(b) by 453 days.

(21) Appl. No.: 13/344,696

(22) Filed: Jan. 6, 2012

(65) Prior Publication Data

US 2012/0179411 A1   Jul. 12, 2012

(30) Foreign Application Priority Data

Jan. 11, 2011   (JP) .................. 2011-003402

(51) Int. Cl.
G01R 31/00 (2006.01)
G01R 31/02 (2006.01)
G01R 35/00 (2006.01)
G06F 11/00 (2006.01)
G01R 19/165 (2006.01)
G01R 31/36 (2006.01)

(52) U.S. Cl.
CPC .............. G01R 31/026 (2013.01); G01R 35/00 (2013.01); G01R 19/16542 (2013.01); G01R 31/3658 (2013.01)
USPC ............ 702/117; 702/118; 702/188; 702/189

(58) Field of Classification Search
CPC ........................ G01R 31/3658; G01R 19/2513
USPC ...................... 702/63–65, 117, 188
See application file for complete search history.

(56) References Cited

U.S. PATENT DOCUMENTS

| 7,471,065 B2 * | 12/2008 | Emori et al. .................. 320/116 |
| 2008/0143298 A1 * | 6/2008 | Yoshida ........................ 320/136 |
| 2009/0130542 A1 * | 5/2009 | Mizoguchi et al. ............. 429/61 |

FOREIGN PATENT DOCUMENTS

| JP | 2001-053613 A | 2/2001 |
| JP | 2001-116776 A | 4/2001 |
| JP | 2002-343445 A | 11/2002 |
| JP | 2004-104989 A | 4/2004 |
| JP | 2004-170335 A | 6/2004 |
| JP | 2005-168118 A | 6/2005 |
| JP | 2006-029923 A | 2/2006 |
| JP | 2006-050784 A | 2/2006 |
| JP | 2007-225484 A | 9/2007 |
| JP | 2009-005178 A | 1/2009 |
| JP | 2009-095222 A | 4/2009 |
| JP | 2010-060435 A | 3/2010 |

* cited by examiner

Primary Examiner — Phuong Huynh
(74) Attorney, Agent, or Firm — Rabin & Berdo, P.C.

(57) ABSTRACT

When line break detection of signal line Ln is carried out, potential smaller than signal line Ln−1 having lower potential than signal line Ln is supplied to signal line Ln, and potentials of signal line Ln and signal line Ln−1 are compared. If potential of signal line Lc>signal line Li, it is detected no line break, and if signal line Lc<signal line Li, it is detected that a line break exists. Then, potential larger than signal line Ln+1 having higher potential than signal line Ln is supplied to signal line Ln, and potentials of the signal line Ln and signal line Ln+1 are compared. If potential of signal line Lc<signal line Li, it is detected no line break, and if signal line Lc>signal line Li, it is detected that a line break exists.

12 Claims, 29 Drawing Sheets

FIG.7

SEMICONDUCTOR CIRCUIT, SEMICONDUCTOR DEVICE, LINE BREAK DETECTION METHOD, AND COMPUTER READABLE MEDIUM STORING LINE BREAK DETECTION PROGRAM

CROSS-REFERENCE TO RELATED APPLICATION

This application claims priority under 35 USC 119 from Japanese Patent Application No. 2011-003402, filed on Jan. 11, 2011, the disclosure of which is incorporated by reference herein.

BACKGROUND OF THE INVENTION

1. Field of the Invention

The present invention relates to a semiconductor circuit, a semiconductor device, a line break detection method, and a computer readable medium storing a line break detection program. The present invention particularly relates to a semiconductor circuit, semiconductor device, line break detection method, and computer readable medium storing a line break detection program, for monitoring battery voltages.

2. Description of the Related Art

A battery in which plural batteries (battery cells) are connected in series (as a specific example, a lithium ion battery or the like) is commonly used as a high power output battery with a large capacity, to be used for driving a motor of a hybrid automobile or an electric automobile, or the like. A battery monitoring system for monitoring and controlling voltages of the cells of the battery is known.

A conventional battery monitoring system is provided with a battery cell group, including plural battery cells, and a semiconductor circuit that measures and controls voltages of the battery cells included in the battery cell group.

In the conventional battery monitoring system, cell voltage equalization processing of the battery cell group (to make respective voltage values of the battery cells equal), charge/discharge control processing (control of charging and discharging of the battery cells), and the like, are carried out on the basis of voltage information of the battery cells that is obtained from the semiconductor circuit for measurement. In this battery monitoring system, if there is a line break in a signal line that connects a battery cell with the semiconductor circuit for measurement or suchlike, defect may arise in the battery monitoring system.

Accordingly, technologies for detecting a break in a signal line are known (Japanese Patent Application Laid-Open (JP-A) Nos. 2002-343445, 2001-116776, 2006-29923, 2004-170335, 2005-168118, 2004-104989, 2006-50784 and 2007-225484).

In the technologies recited in JP-A Nos. 2002-343445, 2001-116776 and 2006-29923, a resistance for detecting a line break is connected to between the battery cells, and a current from the battery cells always flows through this resistance. Therefore, in order to suppress a current during standby (a dark current), the resistance value must be made large. However, there are limitations on the resistance value and therefore may be difficult to suppress the dark current.

In the technologies recited in JP-A Nos. 2004-170335, 2005-168118, 2004-104989 and 2006-50784, an operation in which battery cells are short-circuited with a switch is required for detecting a line break. If the battery cells are not in an over-charged condition, this operation causes a discharge operation. As a result, battery voltages may become uneven between the battery cells.

In the technologies recited in JP-A Nos. 2004-170335 and 2007-225484, a battery voltage measurement circuit for measuring battery voltages, and a calculation device for calculating battery voltage differences, are required to determine whether there is a line break. In these technologies, plural voltages must be measured by the battery voltage measurement circuit and calculations performed by the calculation device. Consequently, these technologies may take time to detect a line break, and may be difficult to reduce the duration thereof. Moreover, it may be difficult for a semiconductor circuit in which only one battery voltage measurement circuit is provided to measure the battery cell voltages continuously during a line break detection period.

SUMMARY OF THE INVENTION

The present invention provides a semiconductor circuit, semiconductor device, line break detection method and line break detection program that may properly detect a line break of a signal line associated with a battery.

A first aspect of the invention is a semiconductor circuit including: a plurality of battery voltage signal lines, each signal line connected to both ends of each of a plurality of batteries that are connected in series; a first connection portion, provided at each battery voltage signal line, that connects the battery voltage signal line with a first signal line; a second connection portion, provided at each battery voltage signal line, that connects the battery voltage signal line with a second signal line; a first voltage supply section, provided at each battery voltage signal line, that supplies the battery voltage signal line with a voltage higher than a voltage at a high potential side of the battery to whose low potential side the battery voltage signal line is connected; a second voltage supply section, provided at each battery voltage signal line, that supplies the battery voltage signal line with a voltage lower than a voltage at the low potential side of the battery to whose high potential side the battery voltage signal line is connected; and a comparison section that compares a voltage of the first signal line with a voltage of the second signal line, and that outputs a comparison result.

A second aspect of the invention is a semiconductor device including: a plurality of batteries connected in series; and a semiconductor circuit according to the first aspect that is connected to the plurality of batteries.

A third aspect of the invention is a line break detection method in a semiconductor circuit including, a plurality of battery voltage signal lines, each signal line connected to both ends of each of a plurality of batteries that are connected in series, provided at each battery voltage signal line, a first connection portion that connects the battery voltage signal line with a first signal line, a second connection portion that connects the battery voltage signal line with a second signal line, a first voltage supply section that supplies the battery voltage signal line with a voltage higher than a voltage at a high potential side of the battery to whose low potential side the battery voltage signal line is connected, and a second voltage supply section that supplies the battery voltage signal line with a voltage lower than a voltage at the low potential side of the battery to whose high potential side the battery voltage signal line is connected, and a comparison section that compares a voltage of the first signal line with a voltage of the second signal line and outputs a comparison result, the method including: controlling the first connection portion to connect the first signal line with a battery voltage signal line among the battery voltage signal lines at which a detection of the line break is being carried out; controlling the second connection portion to connect the second signal line with the battery voltage signal line that is connected to the high potential side of the battery to whose low potential side the battery voltage signal line at which the detection is being carried out is connected; controlling the first voltage supply section to supply the voltage thereof; detecting the line break in the battery voltage signal line on the basis of a comparison result outputted from the comparison section; controlling the first connection portion to connect the first signal line with the battery voltage signal line at which the detection of the line break is being carried out; controlling the second connection portion to connect the second signal line with the battery voltage signal line that is connected to the low potential side of the battery to whose high potential side the battery voltage signal line at which the detection is being carried out is connected; controlling the second voltage supply section to supply the voltage thereof; and detecting the existence or non-existence of a line break in the battery voltage signal line on the basis of a comparison result outputted from the comparison section.

A fourth aspect of the invention is a computer readable medium storing a line break detection program for causing a computer to execute a process for detecting a line break in a battery voltage signal line of a semiconductor circuit including, a plurality of battery voltage signal lines, each signal line connected to both ends of each of a plurality of batteries that are connected in series, provided at each battery voltage signal line, a first connection portion that connects the battery voltage signal line with a first signal line, a second connection portion that connects the battery voltage signal line with a second signal line, a first voltage supply section that supplies the battery voltage signal line with a voltage higher than a voltage at a high potential side of the battery to whose low potential side the battery voltage signal line is connected, and a second voltage supply section that supplies the battery voltage signal line with a voltage lower than a voltage at the low potential side of the battery to whose high potential side the battery voltage signal line is connected, and a comparison section that compares a voltage of the first signal line with a voltage of the second signal line and outputs a comparison result, the process including: controlling the first connection portion to connect the first signal line with a battery voltage signal line among the battery voltage signal lines at which a detection of the line break is being carried out; controlling the second connection portion to connect the second signal line with the battery voltage signal line that is connected to the high potential side of the battery to whose low potential side the battery voltage signal line at which the detection is being carried out is connected; controlling the first voltage supply section to supply the voltage thereof; detecting the line break in the battery voltage signal line on the basis of a comparison result outputted from the comparison section; controlling the first connection portion to connect the first signal line with the battery voltage signal line at which the detection of the line break is being carried out; controlling the second connection portion to connect the second signal line with the battery voltage signal line that is connected to the low potential side of the battery to whose high potential side the battery voltage signal line at which the detection is being carried out is connected; controlling the second voltage supply section to supply the voltage thereof; and detecting the line break in the battery voltage signal line on the basis of a comparison result outputted from the comparison section.

According to the above-described aspects of the present invention, a line break of a signal line associated with a battery may be properly detected.

BRIEF DESCRIPTION OF THE DRAWINGS

Exemplary embodiments of the present invention will be described in detail based on the following figures, wherein:

FIG. 7 is a circuit diagram illustrating another example of general configuration of the semiconductor circuit according to the first exemplary embodiment;

DETAILED DESCRIPTION OF THE INVENTION

[First Exemplary Embodiment]

Herebelow, a battery monitoring system of a first exemplary embodiment, which is a basic configuration of the present invention, is described in detail with reference to the drawings.

Figure 1:
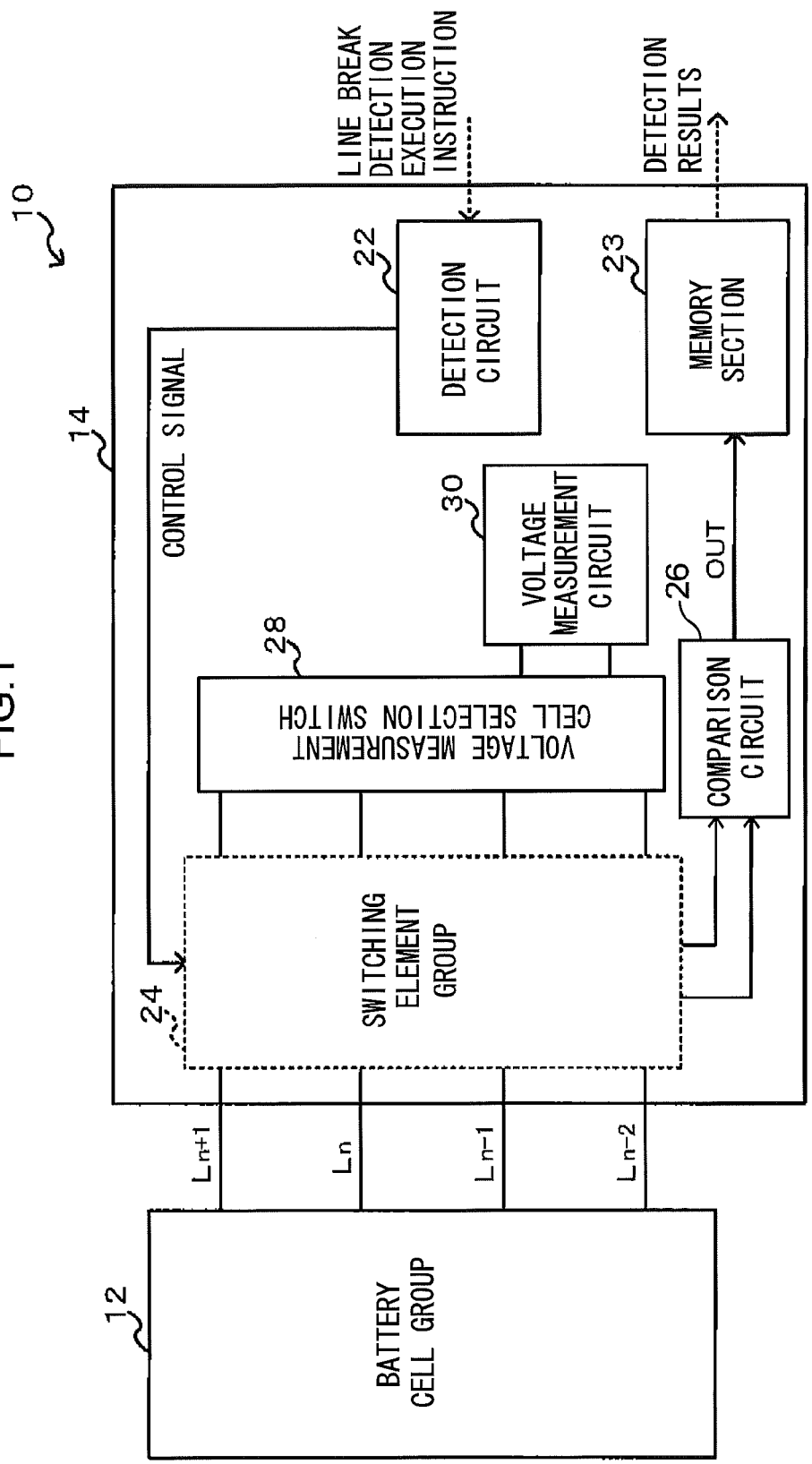
FIG. 1 is a circuit diagram illustrating general configuration of a battery monitoring system according to a first exemplary embodiment.

First, configuration of the battery monitoring system of the present exemplary embodiment is described. An example of general configuration of the battery monitoring system of the present exemplary embodiment is shown in FIG. 1. The battery monitoring system 10 of the present exemplary embodiment illustrated in FIG. 1 is provided with a battery cell group 12 that includes plural battery cells, and a semiconductor circuit 14 that measures voltages of the battery cells of the battery cell group 12.

The semiconductor circuit 14 is provided with a detection circuit 22, a memory section 23, a switching element group 24, a comparison circuit 26, a voltage measurement cell selection switch 28, and a voltage measurement circuit 30.

The detection circuit 22 is a logic circuit for detecting whether there are line breaks in signal lines Ln+1 to Ln−2 on the basis of outputs OUT outputted from the comparison circuit 26. When the detection circuit 22 receives an instruction to detect the existence or non-existence of line breaks in the signal lines Ln+1 to Ln−2, the detection circuit 22 outputs a control signal that implements ON/OFF control of the switching element group 24.

The memory section 23 memorizes the outputs OUT outputted from the comparison circuit 26 (logical values representing a high level and a low level). A specific example of the memory section 23 is a register. In the present exemplary embodiment, an external device detects the existence or non-existence of line breaks on the basis of the logic values memorized (stored) in the memory section 23.

Figure 2:
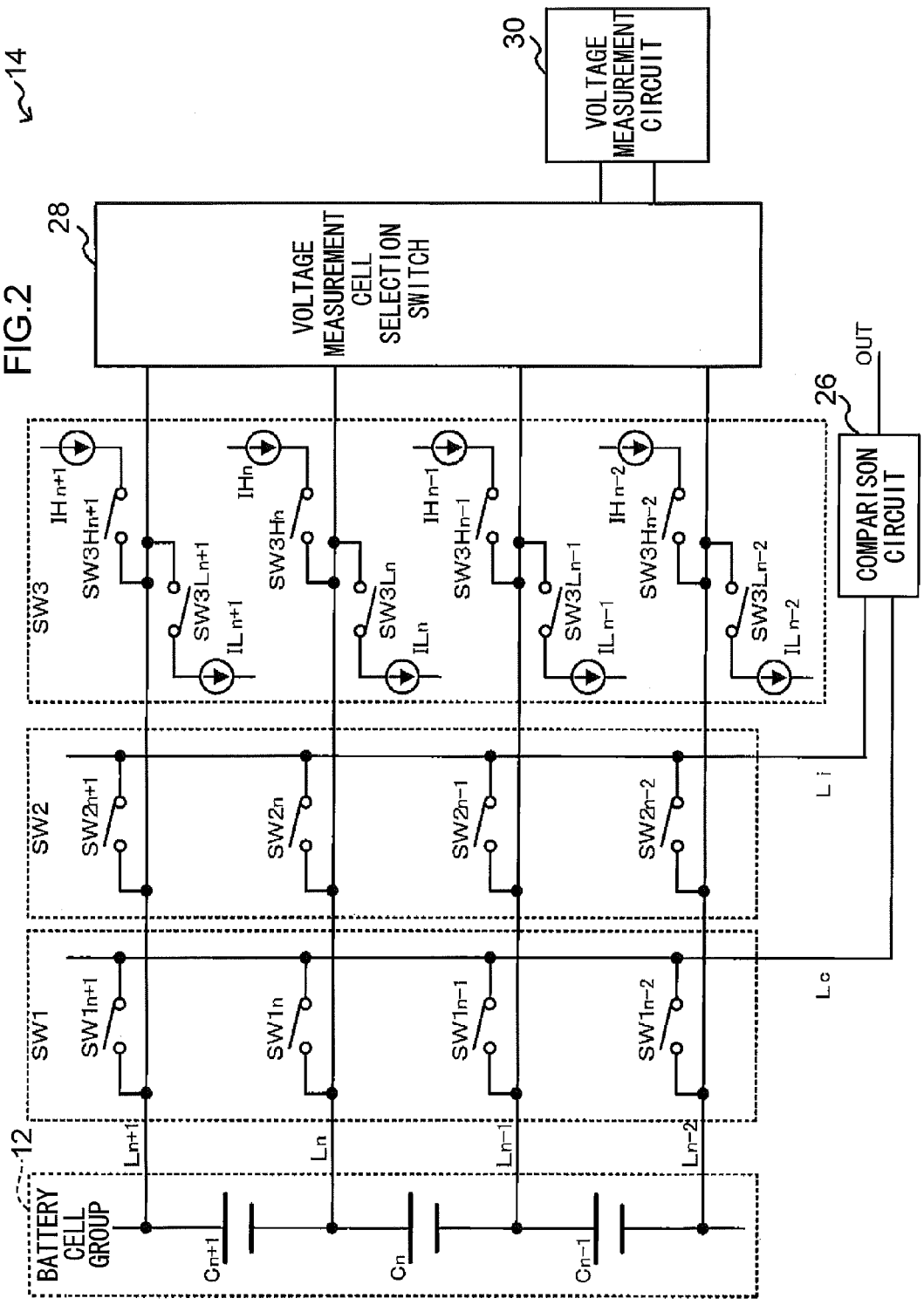
FIG. 2 is a circuit diagram illustrating general configuration of a semiconductor circuit according to the first exemplary embodiment.

An example of general configuration of the semiconductor circuit 14 of the present exemplary embodiment is shown in FIG. 2. In the present exemplary embodiment, as a specific example, the battery cell group 12 includes three cells C (Cn−1 to Cn+1, which are referred to in general as cells C, and the battery cell group 12 is connected to the semiconductor circuit 14 by signal lines Ln−2 to Ln+1 (which are referred to in general as signal lines L). Note that, descriptions of the detection circuit 22 and the memory section 23 are not given in FIG. 2.

The semiconductor circuit 14 illustrated in FIG. 2 is provided with the switching element group 24, the comparison circuit 26, the voltage measurement cell selection switch 28 and the voltage measurement circuit 30. The switching element group 24 includes a switching element group SW1, a switching element group SW2, and a switching element group SW3 that includes voltage adjustment sections IH and IL.

The voltage measurement cell selection switch 28 is provided with plural internal switching elements SW (not illustrated) and, by switching the internal switching elements SW, selects the voltage (signal line L) at the high potential side and the voltage (signal line L) at the low potential side of a cell C whose battery voltage is to be measured and monitored. The voltage measurement circuit 30 measures the battery voltage of the cell C on the basis of the voltages selected by the voltage measurement cell selection switch 28.

The switching element group SW1 connects the signal lines L with a signal line Lc. The switching element group SW1 connects a signal line L at which line break detection is to be carried out with the signal line Lc in accordance with a control signal from the detection circuit 22. The switching element group SW1 is provided with a switching element SW1 for each signal line L (SW1n−2 to SW1n+1, which are referred to in general as switching elements SW1).

The switching element group SW2 connects the signal lines L with a signal line Li. The switching element group SW2 connects a signal line L, to which a battery voltage with a higher potential than the signal line L at which line break detection is being carried out is supplied, with the signal line Li in accordance with a control signal from the detection circuit 22. The switching element group SW2 also connects a signal line L, to which a battery voltage with a lower potential than the signal line L at which line break detection is being carried out is supplied, with the signal line Li in accordance with a control signal from the detection circuit 22. The switching element group SW2 is provided with a switching element SW2 for each signal line L (SW2n−2 to SW2n+1, which are referred to in general as switching elements SW2).

The switching element group SW3 is provided with switching element groups SW3H and SW3L and the voltage adjustment sections IH and IL. A switching element SW3 is provided for each signal line L (SW3n−2 to SW3n+1, which are referred to in general as the switching elements SW3; the switching elements SW3H and SW3L and the voltage adjustment sections IH and IL are similarly referred to in general by omitting the reference numerals indicating the individuals).

The voltage adjustment section IH of each switching element SW3 is connected to the signal line L by the switching element SW3H. The voltage adjustment section IH of the present exemplary embodiment is a constant current source, and supplies the signal line L with a voltage higher than the voltage of a signal line L to which a higher voltage than the usual voltage of the signal line L is supplied. As a specific example, the voltage adjustment section IHn that is connected to the signal line Ln by the switching element SW3Hn supplies a higher voltage to the signal line Ln than a voltage source voltage supplied to the signal line Ln+1.

The voltage adjustment section IL of each switching element SW3 is connected to the signal line L by the switching element SW3L. The voltage adjustment section IL of the present exemplary embodiment is a constant current source, and supplies the signal line L with a voltage lower than the voltage of a signal line L to which a lower voltage than the usual voltage of the signal line L is supplied. As a specific example, the voltage adjustment section ILn that is connected to the signal line Ln by the switching element SW3Ln supplies a lower voltage to the signal line Ln than a voltage source voltage supplied to the signal line Ln−1.

The comparison circuit 26 compares a voltage of signal line Lc with a voltage of signal line Li and outputs the comparison result as the output OUT. In the present exemplary embodiment, as a specific example, the output OUT is at the high level when the voltage of signal line Lc is lower than the voltage of signal line Li and the output OUT is at the low level when the voltage of signal line Lc is higher than the voltage of signal line Li.

Next, a line break detection operation of the semiconductor circuit 14 of the present exemplary embodiment is described.

Figure 4:
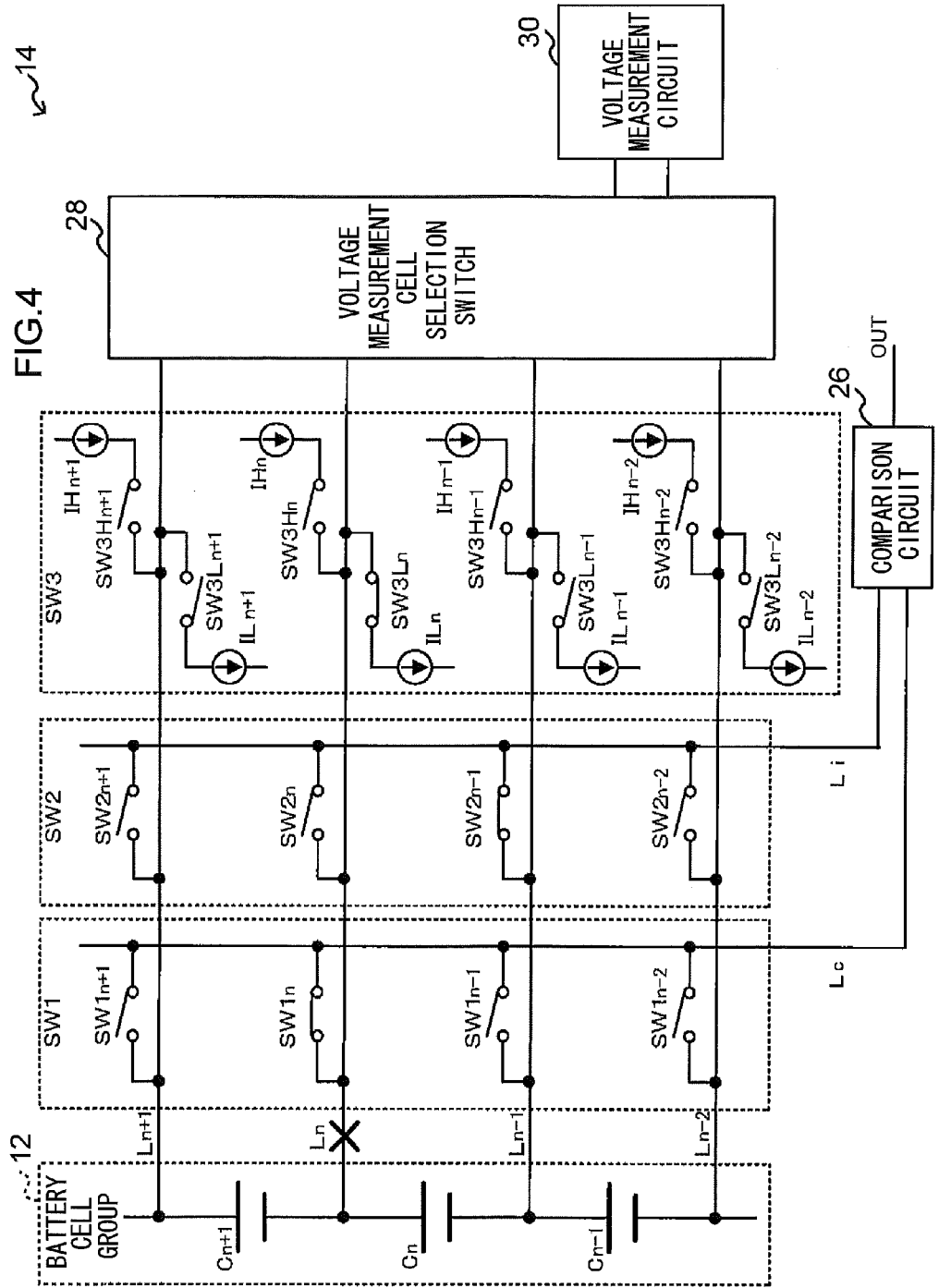
FIG. 4 is a circuit diagram illustrating a state of the semiconductor circuit in comparison operation 1, according to the first exemplary embodiment.

Herebelow, as a specific example, detection of a line break of the signal line Ln (see the "X" mark in FIG. 4) is described in detail.

Figure 3:
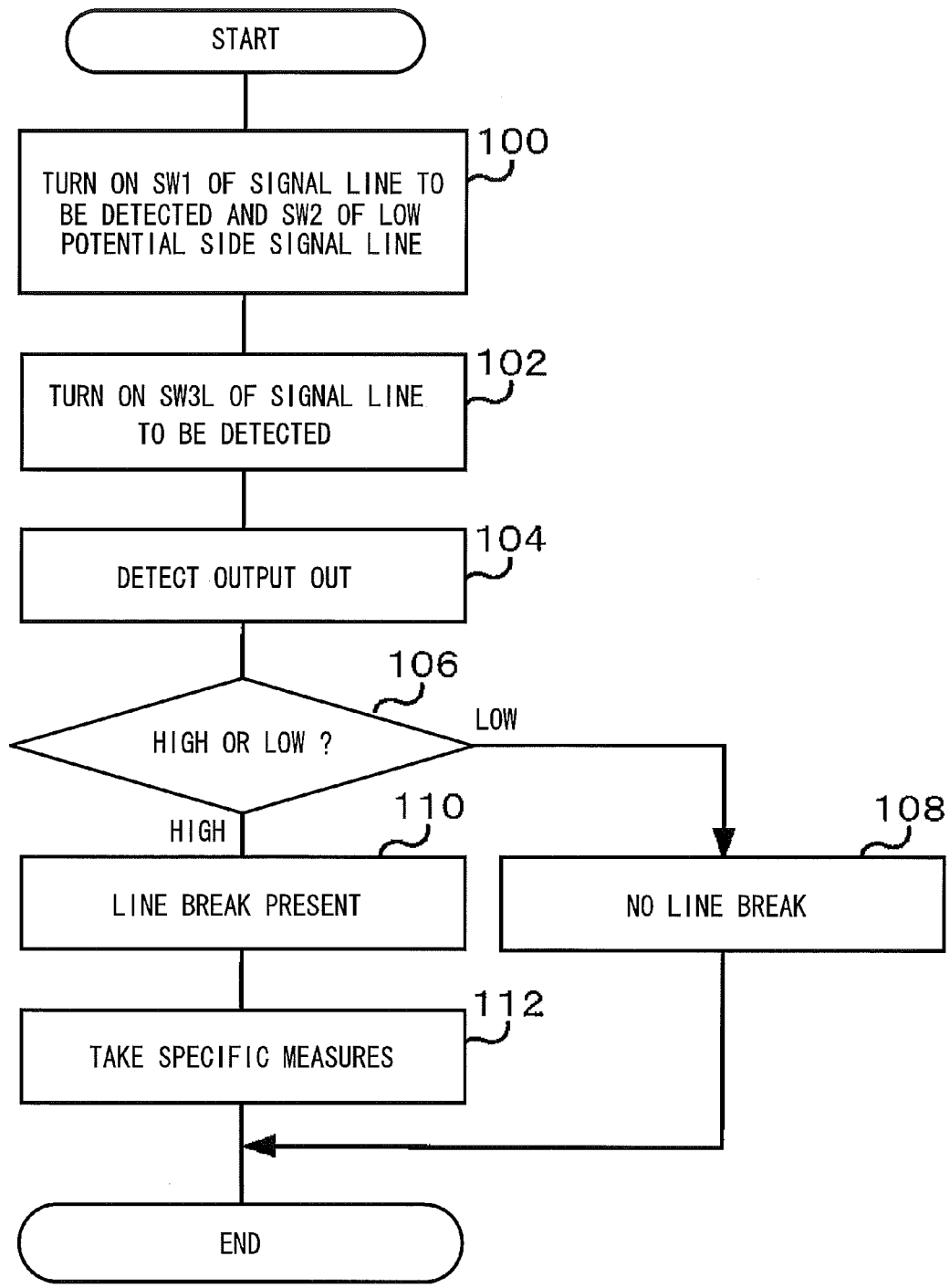
FIG. 3 is a flowchart showing a flow of a line break detection operation (comparison operation 1) according to the first exemplary embodiment.

Firstly, a line break detection operation for when detecting a line break by comparing with the battery voltage supplied to the signal line L at the low potential side (comparison operation 1) is described. FIG. 3 shows a flowchart of an example of flow of the line break detection operation of the present exemplary embodiment.

In an initial state, all of the switching elements SW1, the switching elements SW2 and the switching elements SW3 are turned OFF.

In step 100, the switching element SW1 of the signal line L to be detected and the switching element SW2 of the signal line L at the low potential side thereof are turned ON. In the specific example, the switching element SW1$n$ is turned ON and the switching element SW2$n$−1 is turned ON (see FIG. 4).

Then, in step 102, the switching element SW3L of the signal line Ln being detected is turned ON. In the specific example, the switching element SW3Ln is turned ON (see FIG. 4). Thus, the voltage adjustment section ILn is connected to the signal line Ln.

Here, the potential of the signal line Li is at the potential of the battery voltage at the low potential side of cell Cn. If the signal line Ln is not broken, the potential of signal line Lc is at the potential of the battery voltage at the high potential side of cell Cn. Therefore, if the signal line Ln is not broken, the potential of signal line Lc is greater than the potential of signal line Li.

If the signal line Ln is broken, however, the potential of signal line Lc is pulled down to the potential of the voltage adjustment section ILn. In the present exemplary embodiment, because the potential of the voltage adjustment section ILn is smaller than the potential of signal line Ln−1, the potential of signal line Lc is then less than the potential of signal line Li.

The comparison circuit 26 of the present exemplary embodiment outputs the low level when the potential of signal line Lc is greater than the potential of signal line Li, and outputs the high level when the potential of signal line Lc is less than the potential of signal line Li.

Then, in step 104, the output OUT outputted by the comparison circuit 26 is detected, and in step 106 it is determined whether the output OUT is at the high level or the low level. If it is at the low level, the operation proceeds to step 108 and, as indicated above, it is detected that there is no line break, after which the present operation ends. On the other hand, if the output is at the high level, the operation proceeds to step 110 and, as indicated above, it is detected that a line break exists. When there is a line break, the operation proceeds to step 112 and specific measures such as, for example, operation of the battery monitoring system 10 being stopped or the like are taken, after which the present processing ends.

Figure 5:
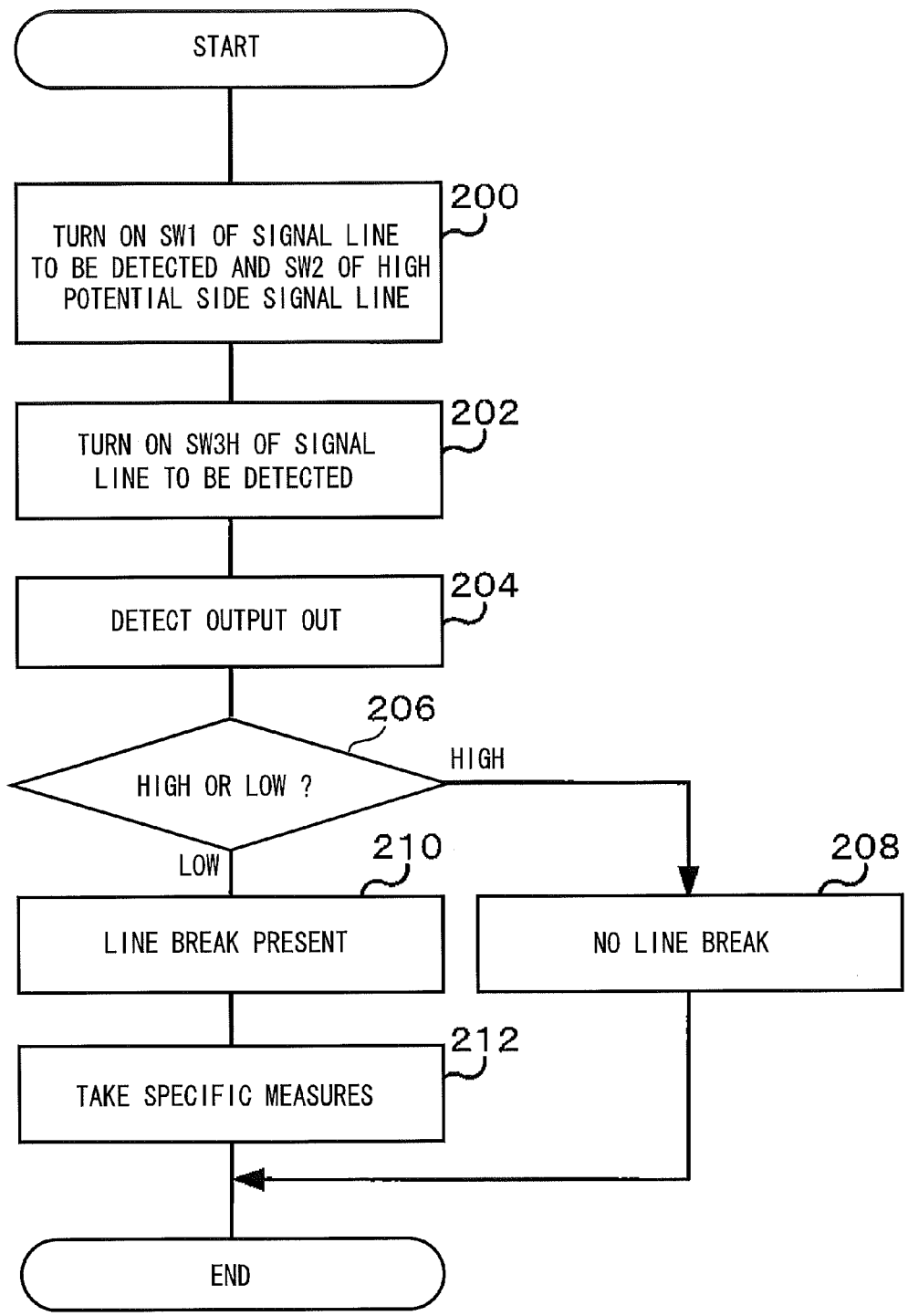
FIG. 5 is a flowchart showing a flow of a line break detection operation (comparison operation 2) according to the first exemplary embodiment.

Next, a line break detection operation for when detecting a line break by comparing with the battery voltage supplied to the signal line L at the high potential side (comparison operation 2) is described. FIG. 5 shows a flowchart of an example of flow of the line break detection operation of the present exemplary embodiment.

In an initial state, all of the switching elements SW1, the switching elements SW2 and the switching elements SW3 are turned OFF.

Figure 6:
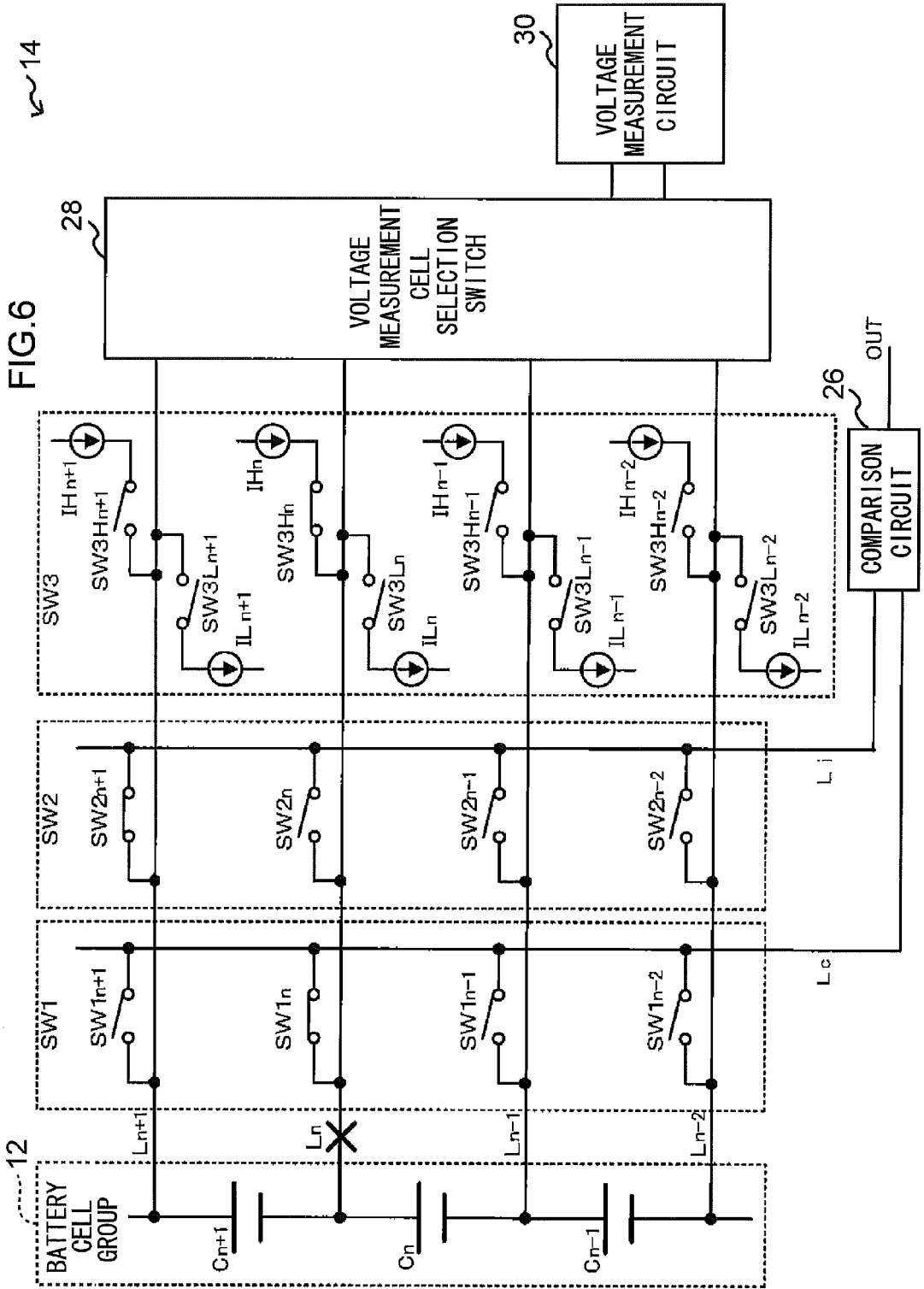
FIG. 6 is a circuit diagram illustrating a state of the semiconductor circuit in comparison operation 2, according to the first exemplary embodiment.

In step 200, the switching element SW1 of the signal line L being detected and the switching element SW2 of the signal line L at the high potential side thereof are turned ON. In the specific example, the switching element SW1$n$ is turned ON and the switching element SW2$n$+1 is turned ON (see FIG. 6). Then, in step 202, the switching element SW3H of the signal line Ln being detected is turned ON. In the specific example, the switching element SW3Hn is turned ON (see FIG. 6). Thus, the voltage adjustment section IHn is connected to the signal line Ln.

Here, the potential of the signal line Li is at the potential of the battery voltage at the high potential side of cell Cn+1. If the signal line Ln is not broken, the potential of signal line Lc is at the potential of the battery voltage at the low potential side of cell Cn+1. Therefore, if the signal line Ln is not broken, the potential of signal line Lc is less than the potential of signal line Li and the output OUT from the comparison circuit 26 is at the high level.

If the signal line Ln is broken, however, the potential of signal line Lc is pulled up to the potential of the voltage adjustment section IHn. In the present exemplary embodiment, because the potential of the voltage adjustment section IHn is larger than the potential of signal line Ln+1, the potential of signal line Lc is greater than the potential of signal line Li and the output OUT from the comparison circuit 26 is at the low level.

Then, in step 204, the output OUT outputted by the comparison circuit 26 is detected, and in step 206 it is determined whether the output OUT is high level or low level. If it is high, the operation proceeds to step 208 and, as indicated above, it is detected that there is no line break, after which the present operation ends. On the other hand, if the output is at the low level, the operation proceeds to step 210 and, as indicated above, it is detected that a line break exists. When there is a line break, the operation proceeds to step 212 and specific measures such as, for example, operation of the battery monitoring system 10 being stopped or the like are taken, after which the present processing ends.

The semiconductor circuit 14 of the present exemplary embodiment detects line breaks by carrying out the line break detection operation in which a line break is detected by a comparison with the battery voltage supplied to the signal line L at the low potential side and the line break detection operation in which a line break is detected by a comparison with the battery voltage supplied to the signal line L at the high potential side, for each of the signal lines L. When line break detection is to be carried out at the signal line Ln+1 at the high potential side of the cell C in the topmost position (cell Cn+1), a line break is detected by a comparison with the signal line Ln, and when line break detection is to be carried out at the signal line Ln−2 at the low potential side of the cell C in the bottommost position (cell Cn−2), a line break is detected by a comparison with the signal line Ln−1.

Output OUT results in the present exemplary embodiment are as in table 1.

TABLE 1

|  | Comparison operation 1 | Comparison operation 2 |
| --- | --- | --- |
| No line break | Low | High |
| Line break present | High | Low |

As described above, the semiconductor circuit 14 of the present exemplary embodiment supplies signal line Ln with a potential smaller than that of signal line Ln−1, to which a battery potential at a lower potential than the usual potential of signal line Ln is supplied, and compares the potential of signal line Ln with the potential of signal line Ln−1. Then, if the potential of signal line Lc is greater than signal line Li (the output OUT=low level), it is detected that there is no line break. On the other hand, if the potential of signal line Lc is less than signal line Li (the output OUT=high level), it is detected that a line break exists. The semiconductor circuit 14 of the present exemplary embodiment also supplies signal line Ln with a potential larger than that of signal line Ln+1, to which a battery potential at a higher potential than the usual potential of signal line Ln is supplied, and compares the potential of signal line Ln with the potential of signal line Ln+1. Then, if the potential of signal line Lc is less than signal line Li (the output OUT=high level), it is detected that there is no line break. On the other hand, if the potential of signal line Lc is greater than signal line Li (the output OUT=low level), it is detected that a line break exists.

In this present exemplary embodiment, the voltage adjustment sections IH and IL are provided, and potentials from the voltage adjustment sections IH and IL are supplied to a signal line for which line break detection is being carried out in accordance with the line break detection operations (comparison operation 1 and comparison operation 2). Therefore, the present exemplary embodiment may properly detect line breaks with the comparison circuit 26.

In the present exemplary embodiment, the voltage adjustment sections IH and IL are not always connected to the signal lines L but connected to the signal lines L only in periods of line break detection. Therefore, in the present exemplary embodiment, currents are not always flowing from the voltage adjustment sections IH and IL, and currents during standby (dark currents) are not produced.

In the present exemplary embodiment, line breaks may be properly detected by the comparison circuit 26. Thus, detection of line breaks is implemented without use of the voltage measurement cell selection switch 28 and the voltage measurement circuit 30. Therefore, in the present exemplary embodiment, line break detection may be carried out even during a period of an operation that uses the voltage measurement cell selection switch 28 and the voltage measurement circuit 30 to measure battery voltages of the cells C.

Figure 7:
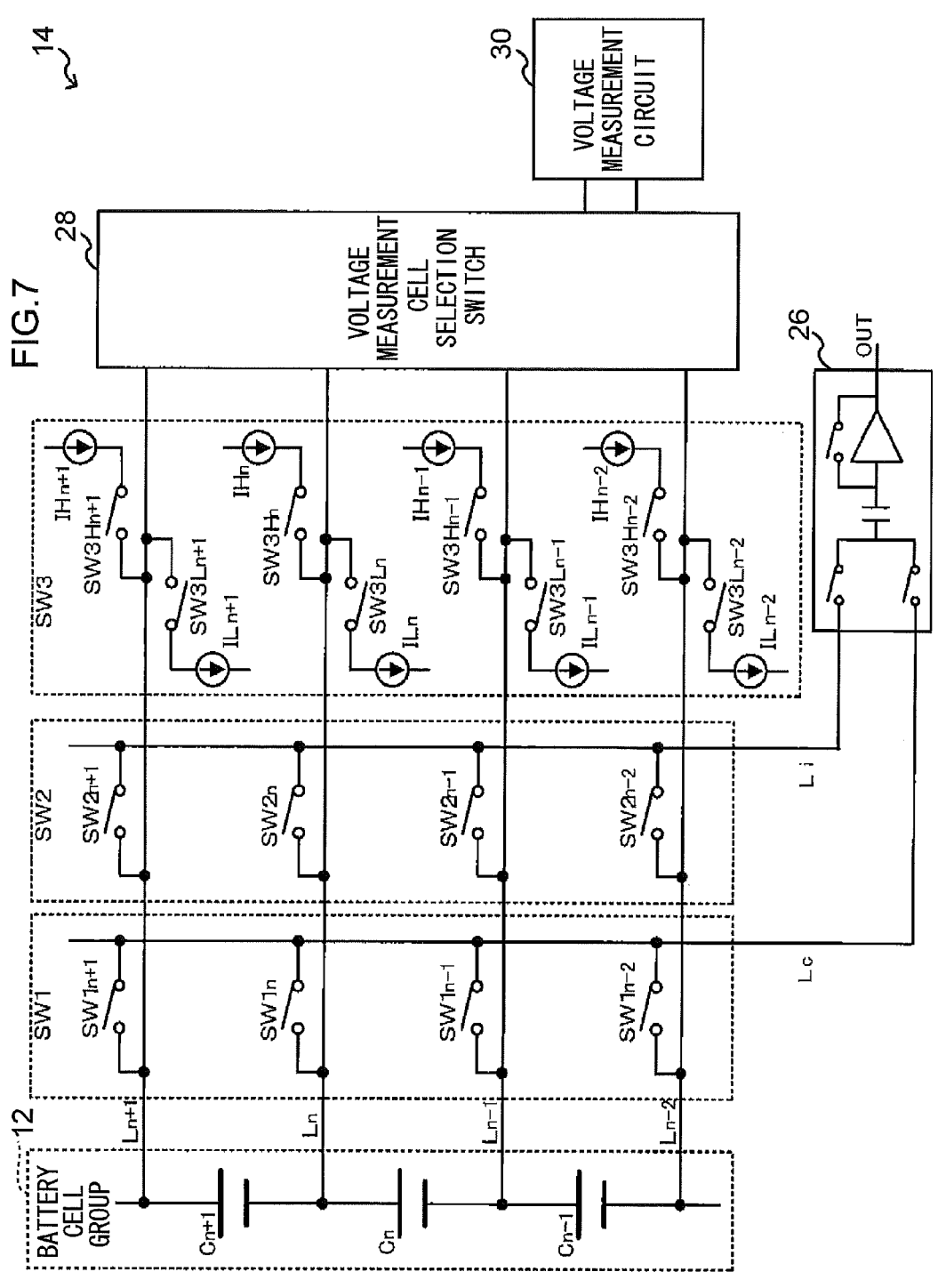

Configuration of the comparison circuit 26 is not particularly limited; for example, a chopper-type comparator such as the comparison circuit 26 illustrated in FIG. 7 may be used. When a chopper-type comparator is used, an offset voltage of the comparison circuit 26 may be eliminated. Operations when the comparison circuit 26 is configured as a chopper-type comparator are described in detail in the exemplary embodiments below.

[Second Exemplary Embodiment]

Herebelow, a semiconductor circuit that is a second exemplary embodiment of the semiconductor device of the present invention, and a line break detection operation that detects a line break of a signal line L are described in detail, with reference to the attached drawings.

Figure 8:
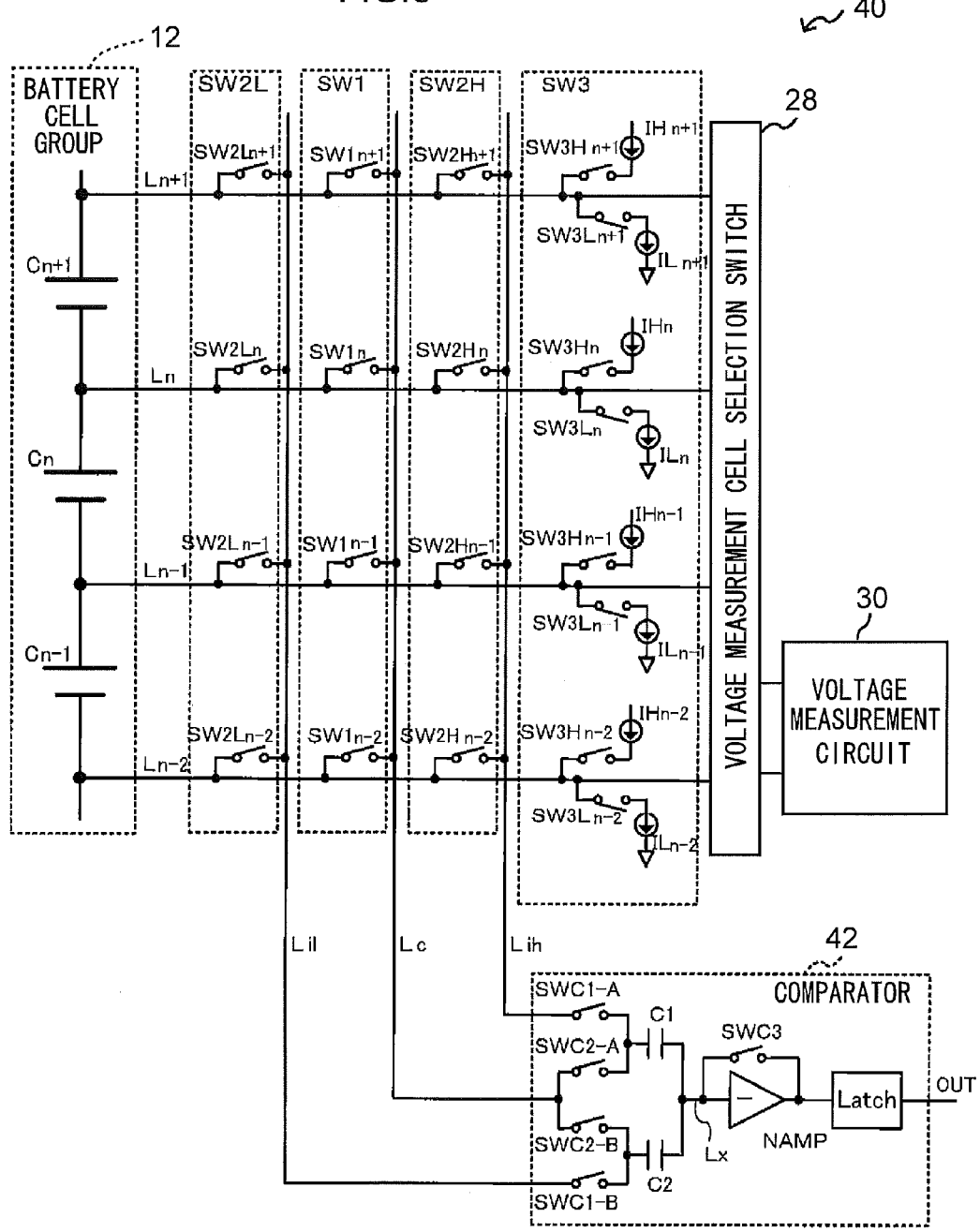
FIG. 8 is a circuit diagram illustrating general configuration of a semiconductor circuit according to a second exemplary embodiment.

FIG. 8 shows an example of general configuration of a semiconductor circuit 40 of the present exemplary embodiment. In the present exemplary embodiment, configurations and operations that are substantially the same as in the first exemplary embodiment are not recited and are not descriptions thereof will be omitted.

In a line break detection operation of the first exemplary embodiment, the switching element SW2 connects signal line L to signal line Li in both comparison operation 1 that compares with the low potential side and comparison operation 2 that compares with the high potential side. In contrast, in the present exemplary embodiment, a switching element SW2L connects signal line L with a signal line Lil for a comparison operation 1 that compares with the low potential side, while a switching element SW2H connects signal line L with a signal line Lih for a comparison operation 2 that compares with the high potential side. Accordingly, the present exemplary embodiment is provided with switching elements SW2L and switching elements SW2H.

A comparison circuit (comparator) 42 of the present exemplary embodiment is configured as a chopper-type comparator. The comparator 42 is provided with switching elements SWC1-A, SWC2-A, SWC1-B and SWC2-B, capacitors C1 and C2, a switching element SWC3, a single-sided inverting amplifier NAMP with a self-threshold voltage Vx, and a latch circuit (Latch).

The switching element SWC1-A connects the signal line Lih with the capacitor C1, and the switching element SWC2-A connects the signal line Lc with the capacitor C1. The switching element SWC1-B connects the signal line Lil with the capacitor C2, and the switching element SWC2-B connects the signal line Lc with the capacitor C2.

The latch circuit establishes and outputs logical values (high level and low level) from output voltages of the single-sided inverting amplifier NAMP.

A line break detection operation of the semiconductor circuit 40 of the present exemplary embodiment is described. In the present exemplary embodiment, similarly to the first exemplary embodiment, line break detection for a signal line Ln (see the "X" mark in FIG. 11) is described in detail as a specific example.

Figure 9:
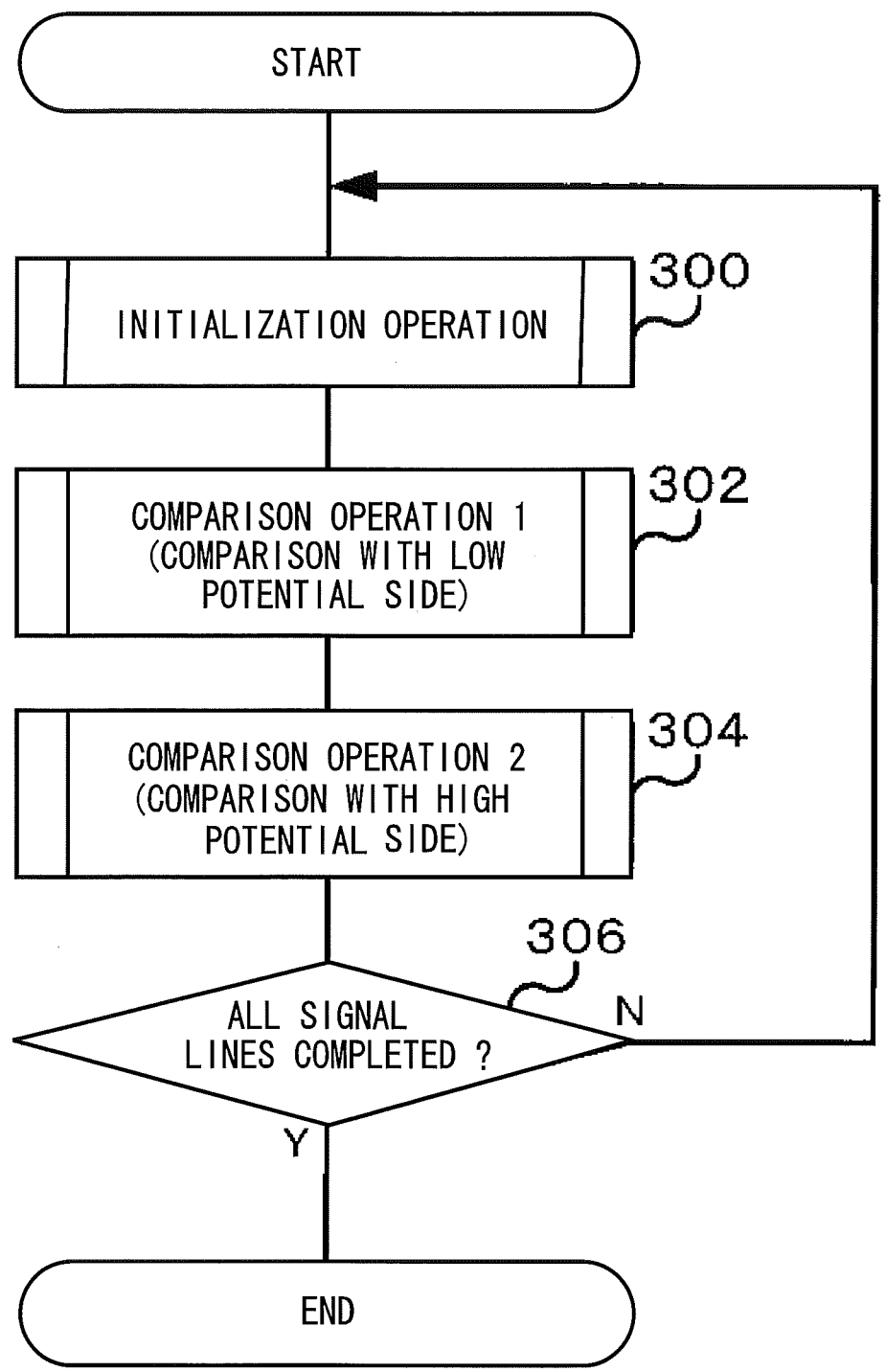
FIG. 9 is a flowchart showing overall flow of a line break detection operation according to the second exemplary embodiment.

A flowchart of an example of overall flow of the line break detection operation of the present exemplary embodiment is shown in FIG. 9.

In step 300, an initialization operation (a starting operation, which is described in detail below) is carried out. Then, in step 302, comparison operation 1 that compares with the low potential side is carried out, and in step 304, comparison operation 2 that compares with the high potential side is carried out. In step 306, it is determined whether or not the operations of steps 300 to 304 have been carried out for all of the signal lines L. If they have not, the operation returns to step 300 and these operations are repeated. On the other hand, when the operations have been carried out for all of the signal lines L, the line break detection operation has ended for all the signal lines L, and the present processing ends.

Next, the operations mentioned above (in FIG. 9) are described in detail.

Figure 10:
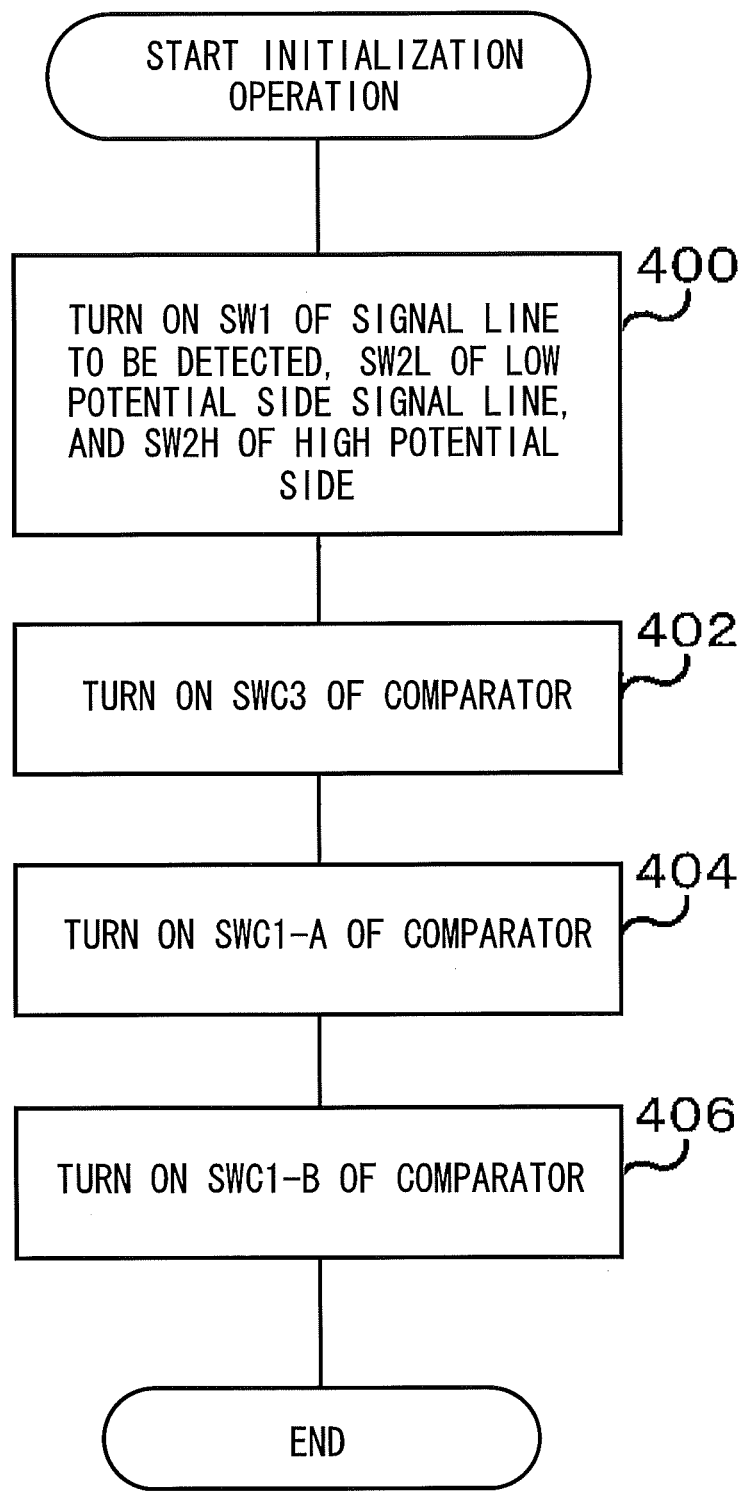
FIG. 10 is a flowchart showing a flow of an initialization operation according to the second exemplary embodiment.

FIG. 10 shows a flowchart of an example of flow of the initialization operation of the present exemplary embodiment (step 300 in FIG. 9).

In step 400, the switching element SW1 of the signal line L to be detected, the switching element SW2L of the signal line L at the low potential side and the switching element SW2H at the high potential side are turned ON. In the specific example, the switching element SW1n is turned ON, the switching element SW2Ln−1 is turned ON, and the switching element SW2Hn+1 is turned ON (see FIG. 11).

Then, in step 402, the switching element SWC3 of the comparator 42 is turned ON. As a result, the voltage of an input signal line Lx of the single-sided inverting amplifier NAMP of the comparator 42 goes to the self-threshold voltage Vx of the single-sided inverting amplifier NAMP.

Figure 11:
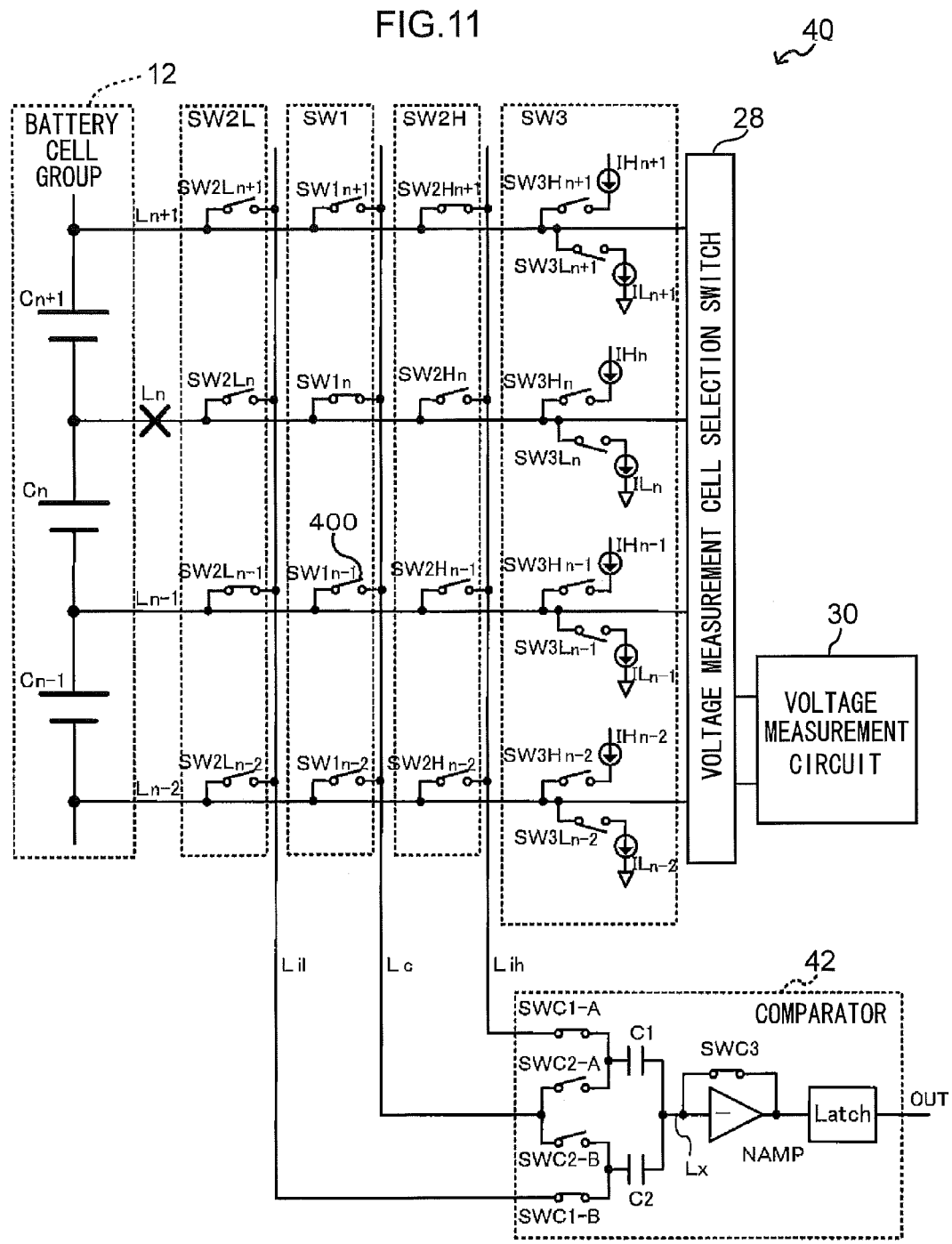
FIG. 11 is a circuit diagram illustrating a state of the semiconductor circuit in the initialization operation, according to the second exemplary embodiment.

In step 404, the switching element SWC1-A of the comparator 42 is turned ON (see FIG. 11). Hence, the capacitor C1 is charged by the difference between the voltage of signal line Lih and the self-threshold voltage Vx (signal line Lih−self-threshold voltage Vx).

In step 406, the switching element SWC1-B of the comparator 42 is turned ON (see FIG. 11), and then the present processing ends. The capacitor C2 is charged by the difference between the voltage of signal line Lil and the self-threshold voltage Vx (signal line Lil−self-threshold voltage Vx).

As a result of this initialization operation, the capacitor C1 is charged by the difference between the voltage of signal line Lih and the self-threshold voltage Vx (signal line Lih−self-threshold voltage Vx), and the capacitor C2 is charged by the difference between the voltage of signal line Lil and the self-threshold voltage Vx (signal line Lil−self-threshold voltage Vx).

Figure 12:
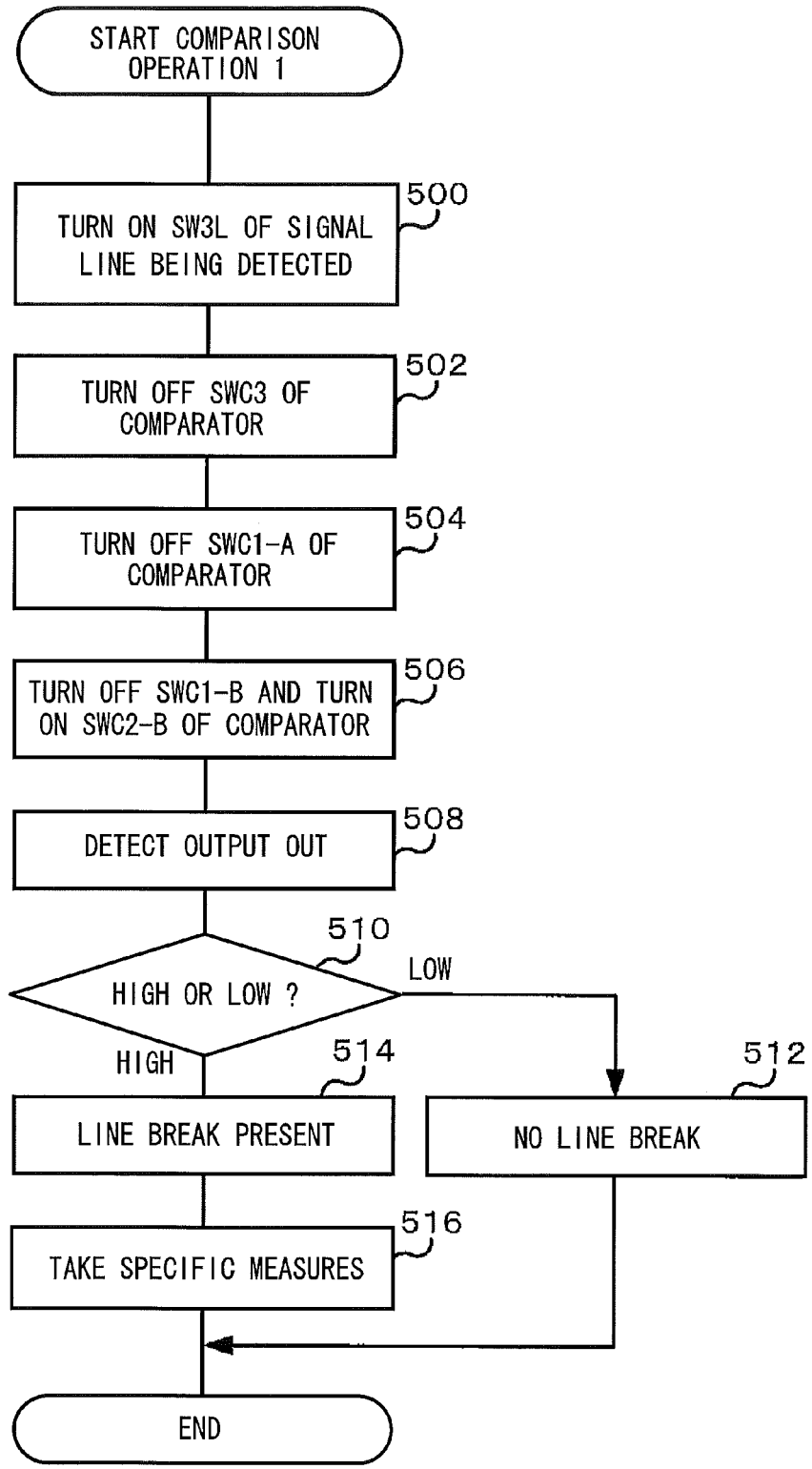
FIG. 12 is a flowchart showing a flow of a comparison operation 1 according to the second exemplary embodiment.

Next, comparison operation 1 (step 302 in FIG. 9) is described. FIG. 12 shows a flowchart of an example of flow of the comparison operation of the present exemplary embodiment.

In step 500, the switching element SW3L of the signal line L to be detected is turned ON. In the specific example, the switching element SW3Ln is turned ON (see FIG. 13). Thus, the voltage adjustment section ILn is connected to the signal line Ln. As a result, the potential of the signal line Ln is pulled down by the voltage adjustment section ILn, and a line break detection current is drawn.

Figure 13:
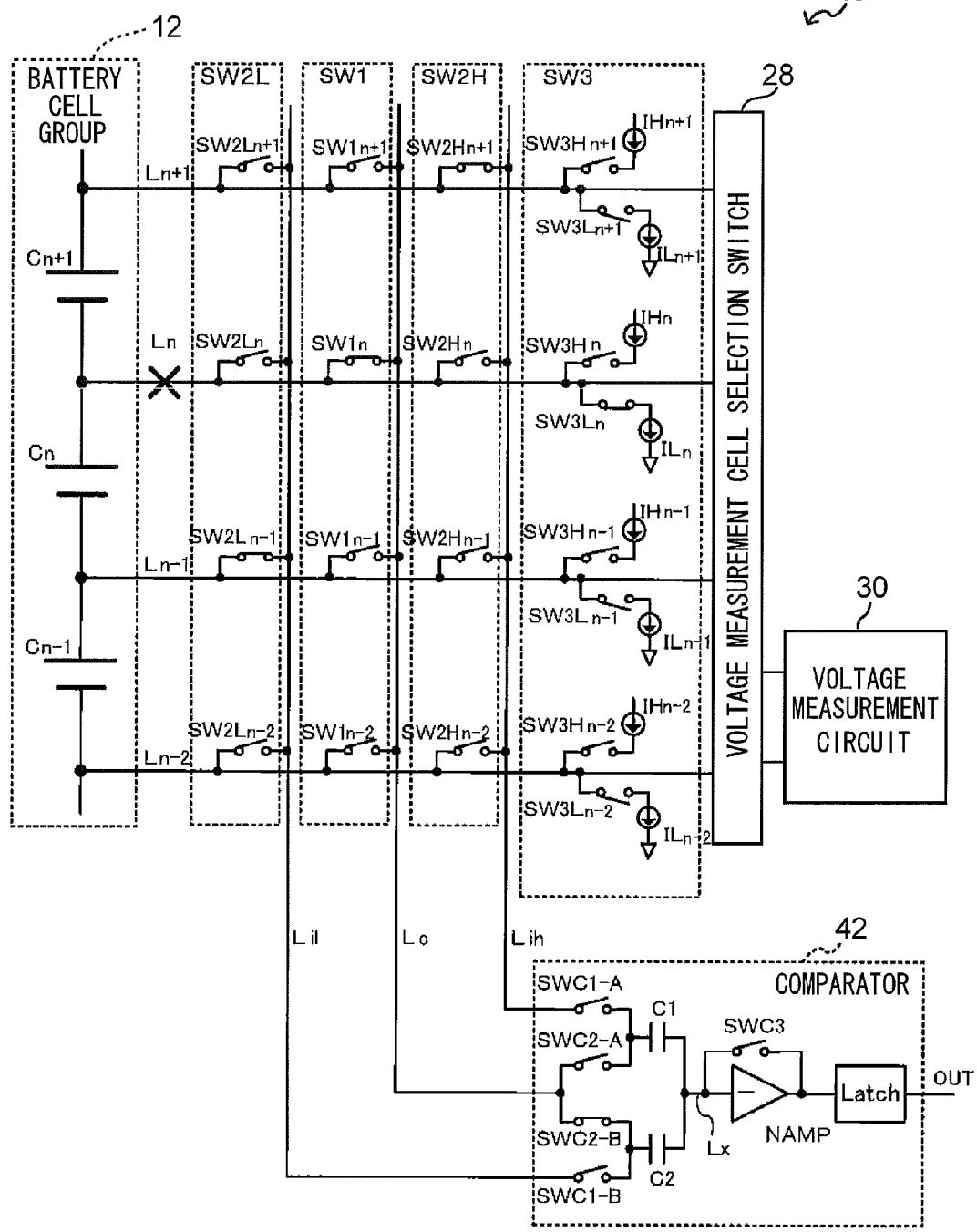
FIG. 13 is a circuit diagram illustrating a state of the semiconductor circuit in comparison operation 1, according to the second exemplary embodiment.

Then, in step 502, the switching element SWC3 of the comparator 42 is turned OFF (see FIG. 13). As a result, the voltage of the input Lx of the single-sided inverting amplifier NAMP turn to a high-impedance state, and the charges at the capacitors C1 and C2 that were charged in the above-described initialization operation are preserved.

In step 504, the switching element SWC1-A of the comparator 42 is turned OFF. Then, in step 506, the switching element SWC1-B is turned OFF and the switching element SWC2-B is turned ON. If the voltage of the input signal line Lx at this time is denoted as voltage Vx', the following expression applies.

$$\text{voltage } Vx' = \text{signal line } Lc - (\text{signal line } Lil - \text{self-threshold voltage } Vx) \quad (1)$$

Therefore, the following expression applies.

$$\text{voltage } Vx' - \text{self-threshold voltage } Vx = \text{signal line } Lc - \text{signal line } Lil \quad (2)$$

Now, if an output voltage of the single-sided inverting amplifier NAMP is denoted as Vnampout and the gain is denoted as Gnamp, the following expression (3) applies.

$$\text{output voltage } Vnampout = -\text{gain } Gnamp \times (\text{Voltage } Vx' - \text{self-threshold voltage } Vx) \quad (3)$$

If the gain Gnamp is sufficiently high, the output logic of the single-sided inverting amplifier NAMP is determined by whether (voltage Vx'−self-threshold voltage Vx) is positive or negative.

When there is no break in the signal line Ln, the current (voltage) that is drawn from the signal line Ln by the voltage adjustment section ILn is supplied from the cell C. Therefore, the voltage of signal line Lc is the voltage of signal line Ln, unaltered. Therefore, expression (4) applies.

$$\text{voltage } Vx' - \text{self-threshold voltage } Vx = (\text{signal line } Ln - \text{signal line } Ln - 1) > 0 \quad (4)$$

Therefore, the output OUT of the comparator 42 is at the low level.

On the other hand, if the signal line Ln is broken, the signal line Lc is a floating node, and the signal line Ln is in a high-impedance state. If the resistance of the high-impedance state of signal line Lc from signal line Ln is denoted as Rhi, the voltage of the signal line Lc through which the line break detection current is drawn is as in expression (5).

$$\text{signal line } Lc = \text{signal line } Ln - \text{current of voltage adjustment section } ILx \times \text{resistance } Rhi \quad (5)$$

If the line break detection current has been specified to satisfy the relationship in the following expression (6), then expression (7) applies and the output OUT of the comparator 42 is at the high level.

$$\text{line break detection current} \times \text{resistance } Rhi > \text{signal line } Ln - \text{signal line } Ln - 1 (= \text{battery voltage of cell } C) \quad (6)$$

$$\text{voltage } Vx' - \text{self-threshold voltage } Vx = (\text{signal line } Ln - \text{signal line } Ln - 1) < 0 \quad (7)$$

Then, in step 508, the output OUT outputted by the comparator 42 is detected, and in step 510 it is determined whether the output OUT is at the high level or the low level. If it is at the low level, the operation proceeds to step 512 and, as described above, it is detected that there is no line break, and the present operation ends. On the other hand, if it is high, the operation proceeds to step 514 and, as described above, it is detected that a line break exists. When there is a line break, the operation proceeds to step 516 and specific measures are taken, after which the present processing ends.

Figure 14:
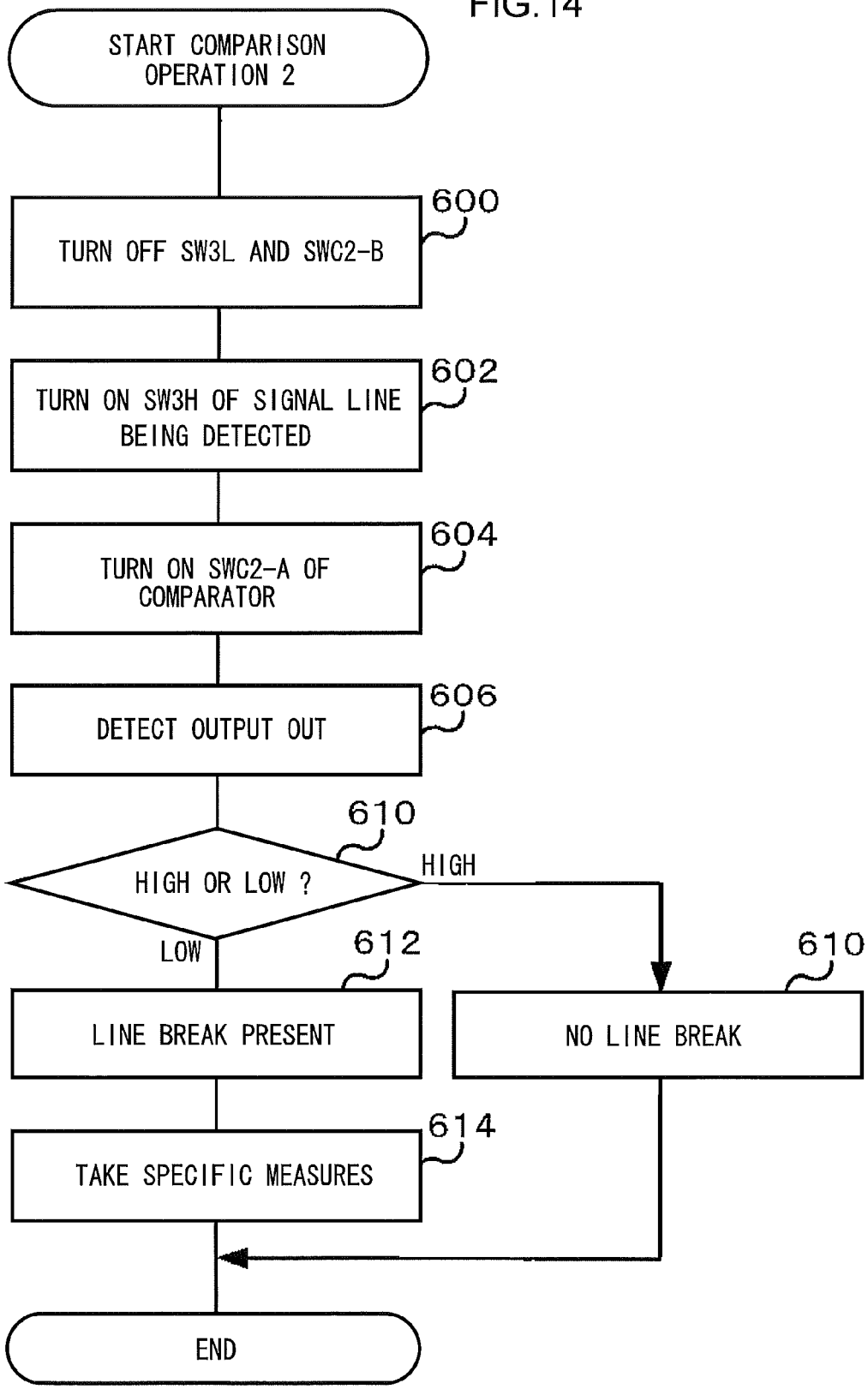
FIG. 14 is a flowchart showing a flow of a comparison operation 2 according to the second exemplary embodiment.

Next, comparison operation 2 (step 304 in FIG. 9) is described. FIG. 14 shows a flowchart of an example of flow of the comparison operation of the present exemplary embodiment. Note that the description is given for comparison operation 2 following on from comparison operation 1.

Figure 15:
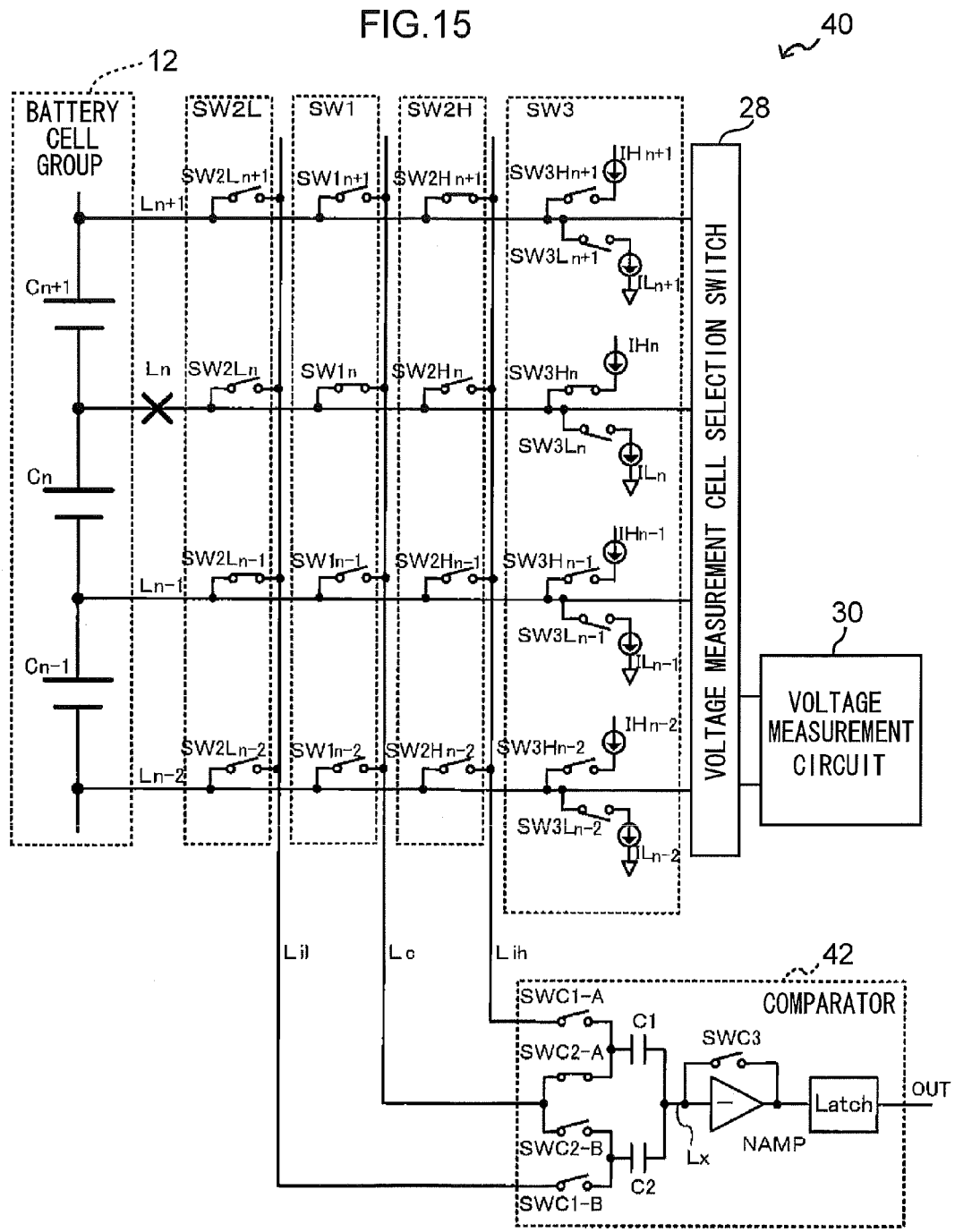
FIG. 15 is a circuit diagram illustrating a state of the semiconductor circuit in comparison operation 2, according to the second exemplary embodiment.

In step 600, the switching element SW3L of the signal line L being detected (switching element SW3Ln) and the switching element SWC2-B of the comparator 42 are turned ON (see FIG. 15).

Then, in step 602, the switching element SW3H of the signal line L being detected is turned ON. In the specific example, the switching element SW3Hn is turned ON (see FIG. 15). Thus, the voltage adjustment section IHn is connected to the signal line Ln. As a result, the potential of the signal line Ln is pulled up by the voltage adjustment section IHn, and a line break detection current is supplied.

Then, in step 604, the switching element SWC2-A of the comparator 42 is turned ON. If the voltage of the input signal line Lx at this time is denoted as voltage Vx', the following expression applies.

$$\text{voltage } Vx' = \text{signal line } Lc - (\text{signal line } Lih - \text{self-threshold voltage } Vx) \quad (8)$$

Therefore, the following expression applies.

$$\text{voltage } Vx' - \text{self-threshold voltage } Vx = \text{signal line } Lc - \text{signal line } Lih \quad (9)$$

When there is no break in the signal line Ln, the current (voltage) that is supplied to the signal line Ln by the voltage adjustment section IHn flows to the cell C. Therefore, the voltage of signal line Lc is the voltage of signal line Ln, unaltered. Therefore, expression (10) applies.

$$\text{voltage } Vx' - \text{self-threshold voltage } Vx = (\text{signal line } Ln - \text{signal line } Ln + 1) < 0 \quad (10)$$

Therefore, the output OUT of the comparator 42 is at the high level.

On the other hand, if the signal line Ln is broken, the signal line Lc is a floating node, and the signal line Ln is in a high-impedance state. If the resistance of the high-impedance state of signal line Lc from signal line Ln is denoted as Rhi, the voltage of the signal line Lc through which the line break detection current is supplied is as in expression (11).

$$\text{signal line } Lc = \text{signal line } Ln + \text{line break detection current} \times \text{resistance } Rhi \quad (11)$$

If the line break detection current has been specified so as to satisfy (line break detection current×resistance Rhi>signal line Ln+1−signal line Ln (=the battery voltage of cell C)), then expression (12) applies and the output OUT of the comparator 42 is at the low level.

$$\text{voltage } Vx' - \text{self-threshold voltage } Vx = (\text{signal line } Ln - \text{signal line } Ln+1) > 0 \quad (12)$$

Then, in step 606, the output OUT outputted by the comparator 42 is detected, and in step 608 it is determined whether the output OUT is at the high level or the low level. If it is high, the operation proceeds to step 610 and, as described above, it is detected that there is no line break and the present operation ends. On the other hand, if it is low, the operation proceeds to step 612 and, as described above, it is detected that a line break exists. When there is a line break, the operation proceeds to step 614 and specific measures are taken, after which the present processing ends.

Output OUT results in the present exemplary embodiment are as in table 2.

TABLE 2

|  | Comparison operation 1 | Comparison operation 2 |
|---|---|---|
| No line break | Low | High |
| Line break present | High | Low |

As described above, the semiconductor circuit 40 of the present exemplary embodiment, when carrying out line break detection of a signal line Ln, charges up the capacitor C1 of the comparator 42 with the difference between the voltage of signal line Lih and the self-threshold voltage Vx (signal line Lih−self-threshold voltage Vx) and charges up the capacitor C2 with the difference between the voltage of signal line Lil and the self-threshold voltage Vx (signal line Lil−self-threshold voltage Vx) by the initialization operation. In comparison operation 1, the line break detection current is drawn from the signal line Ln by the voltage adjustment section ILn, and the signal line Lc is connected with the capacitor C1. The semiconductor circuit 40 of the present exemplary embodiment detects that there is no line break if the output OUT is at the low level and detects that there is a line break if the output OUT is at the high level. In comparison operation 2, the line break detection current is supplied to the signal line Ln by the voltage adjustment section IHn and the signal line Lc is connected with the capacitor C2, and the semiconductor circuit 40 of the present exemplary embodiment detects that there is no line break if the output OUT is at the high level and detects that there is a line break if the output OUT is at the low level.

In this present exemplary embodiment, the voltage adjustment sections IH and IL are provided, and potentials from the voltage adjustment sections IH and IL are supplied to a signal line at which line break detection is being carried out in accordance with the line break detection operations (comparison operation 1 and comparison operation 2). Therefore, the present exemplary embodiment may properly detect line breaks with the comparator 42.

In the present exemplary embodiment, the comparator 42 is configured as a chopper-type comparator that is provided with the capacitors C1 and C2. Thus, the present exemplary embodiment charges the capacitors C1 and C2 with the initialization operation and uses the charged voltages to carry out comparison operation 1 and comparison operation 2. Because two capacitors are provided, the present exemplary embodiment may perform comparison operation 1 and comparison operation 2 consecutively, and there is no need to perform an initialization operation (a charging operation) before comparison operation 2. Therefore, with the present exemplary embodiment, the line break detection operation may be simplified and a duration required for the line break detection operation may be shortened.

In the present exemplary embodiment, the voltage adjustment sections IH and IL are not always connected to the signal lines L but connected to the signal lines L only in periods of line break detection. Therefore, in the present exemplary embodiment, currents are not always flowing from the voltage adjustment sections IH and IL, and currents during standby (dark currents) are not produced.

As mentioned above, the line break detection currents may be specified so as to satisfy the relationship (line break detection current×resistance Rhi>battery voltage of cell C). Therefore, in the present exemplary embodiment, a discharge current when the cells C are short-circuited by a switching element may be small. Thus, the present exemplary embodiment is unlikely to cause variations in battery voltages of the cells C.

In the present exemplary embodiment, line breaks may be properly detected by the comparator 42. Thus, detection of line breaks is implemented without use of the voltage measurement cell selection switch 28 and the voltage measurement circuit 30. Therefore, in the present exemplary embodiment, line break detection may be carried out even during a period of an operation that uses the voltage measurement cell selection switch 28 and the voltage measurement circuit 30 to measure battery voltages of the cells C.

[Third Exemplary Embodiment]

Herebelow, a semiconductor circuit that is a third exemplary embodiment of the semiconductor device of the present invention, and a line break detection operation that detects a line break of a signal line L, are described in detail with reference to the drawings.

Figure 16:
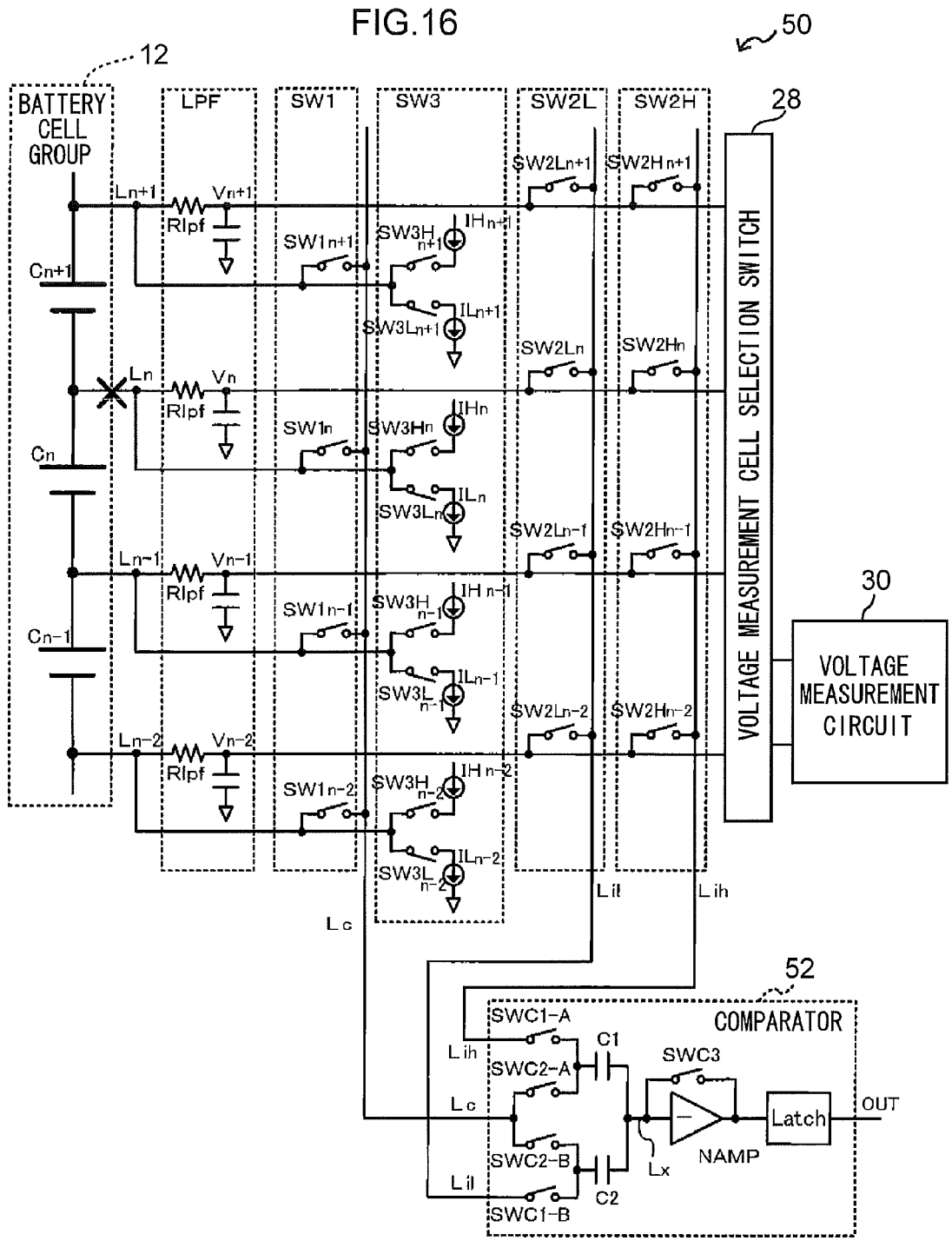
FIG. 16 is a circuit diagram illustrating general configuration of a semiconductor circuit according to a third exemplary embodiment.

FIG. 16 shows an example of general configuration of a semiconductor circuit 50 of the present exemplary embodiment. In the present exemplary embodiment, configurations and operations that are substantially the same as in the first exemplary embodiment or the second exemplary embodiment are not recited and are not description thereof will be omitted.

In the semiconductor circuit 50 of the present exemplary embodiment, low pass filters (LPF) are connected (to the signal lines L) between the battery cell group 12 and the voltage measurement cell selection switch 28. The LPFs cut out high-frequency components. Thus, rapid voltage changes that might occur at the cells C of the battery cell group 12 are suppressed.

The semiconductor circuit 50 of the present exemplary embodiment detects for a line break of each signal line L between the battery cell group 12 and the LPF. Accordingly the semiconductor circuit 50 is configured such that a switching element SW1 connects the signal line L with the signal line Lc between the battery cell group 12 and the LPF, a switching element SW3H connects such that the line break detection current from the voltage adjustment section IH is supplied to the signal line L between the battery cell group 12 and the LPF, and a switching element SW3L connects such that the line break detection current is drawn by the voltage adjustment section IL from the signal line L between the battery cell group 12 and the LPF. Furthermore, the semiconductor circuit 50 of the exemplary embodiment is configured such that switching elements SW2H and SW2L connect the signal lines Lih and Lil with the signal line L between the LPF and the voltage measurement cell selection switch 28. The voltage (potential) outputted from the cell C to the signal line L differs in voltage value (potential) between before and after the LPF. Hereinafter therefore, for convenience in distinguishing between before and after the LPF in the descriptions, the signal line L that is between the battery cell group 12 and the LPF (preceding the LPF) is described as "signal line L", while the signal line L that is between the LPF and the voltage measurement cell selection switch 28 (succeeding the LPF) is described as "signal line V".

A comparison circuit 52 of the present exemplary embodiment has substantially the same configuration as the comparator 42, so is not description thereof will be omitted.

A line break detection operation of the semiconductor circuit 50 of the present exemplary embodiment is described. In the present exemplary embodiment, similarly to the first exemplary embodiment and the second exemplary embodiment, line break detection for a signal line Ln (see the "X" mark in FIG. 16) is described in detail as a specific example.

Figure 17:
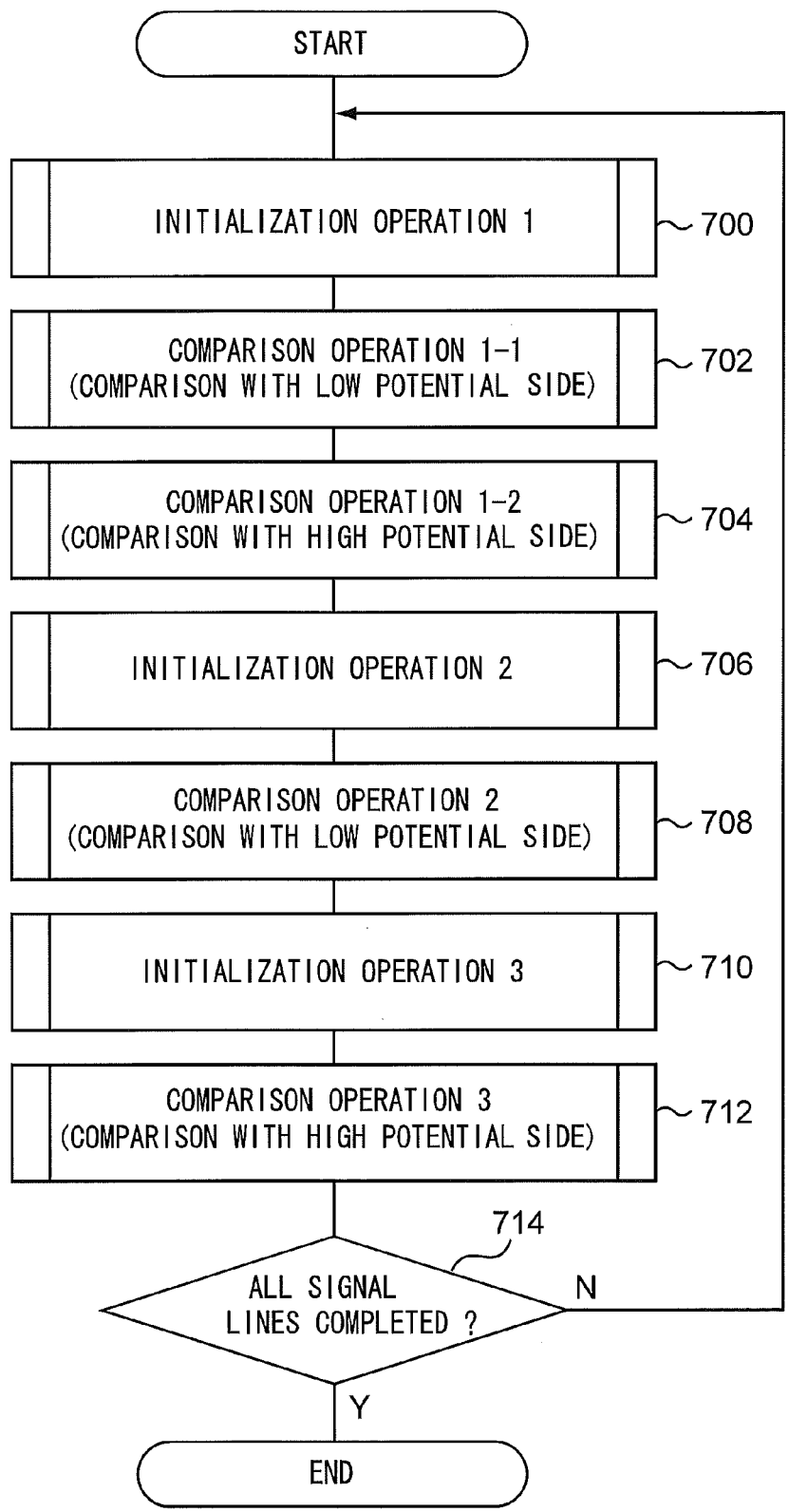
FIG. 17 is a flowchart showing overall flow of a line break detection operation according to the third exemplary embodiment.

A flowchart of an example of overall flow of the line break detection operation of the present exemplary embodiment is shown in FIG. 17. The overall flow is illustrated here, and details of respective operations are described below.

In step 700, an initialization operation 1 is carried out. Then, in step 702, a comparison operation 1-1 that compares with the low potential side is carried out, and in step 704, a comparison operation 1-2 that compares with the high potential side is carried out.

Then, in step 706, an initialization operation 2 is carried out, and in step 708, a comparison operation 2 that compares the signal line V with the low potential side is carried out.

In step 710, an initialization operation 3 is carried out, and in step 712, a comparison operation 3 that compares the signal line V with the high potential side is carried out.

In step 714, it is determined whether or not the operations of steps 700 to 712 have been carried out for all of the signal lines L. If they have not, the operation returns to step 700 and these operations are repeated. On the other hand, when the operations have been carried out for all of the signal lines L, the line break detection operation has ended for all the signal lines L, so the present processing ends.

Next, the operations mentioned above (in FIG. 17) are described in detail.

The initialization operation 1 of the present exemplary embodiment (step 700 in FIG. 16) is substantially the same as the initialization operation of the first exemplary embodiment (see FIG. 10), and therefore description regarding a flowchart will be omitted.

In initialization operation 1, firstly, the switching element SW1 of the signal line L to be detected, the switching element SW2L of the signal line L at the low potential side, and the switching element SW2H at the high potential side, are turned ON. In the specific example, the switching element SW1$n$ is turned ON, the switching element SW2L$n-1$ is turned ON, and the switching element SW2H$n+1$ is turned ON (see FIG. 18).

Then, the switching element SWC3 of the comparator 52 is turned ON. As a result, the voltage of the input signal line Lx of the single-sided inverting amplifier NAMP of the comparator 52 reaches the self-threshold voltage Vx of the single-sided inverting amplifier NAMP.

Figure 18:
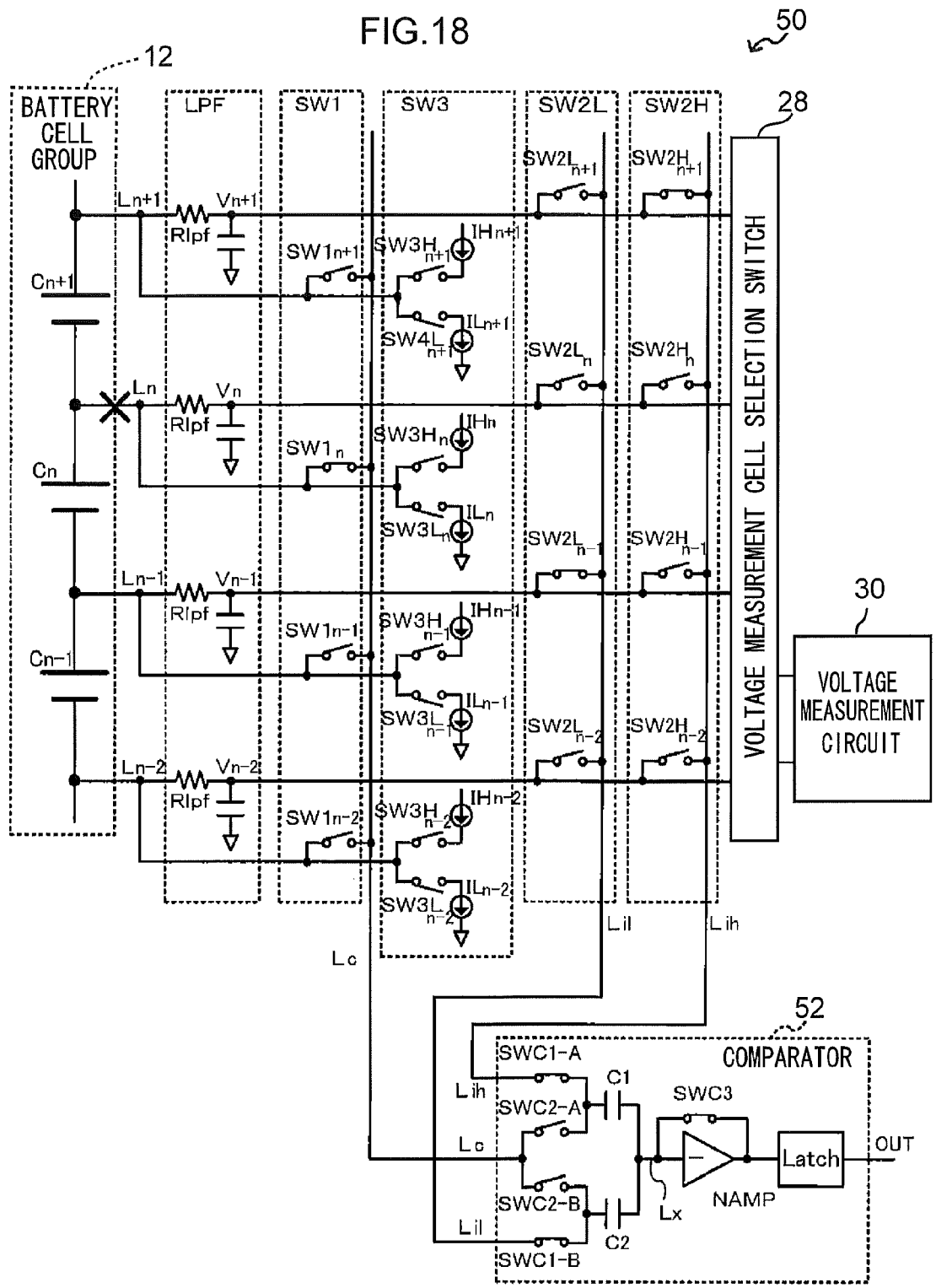
FIG. 18 is a circuit diagram illustrating a state of the semiconductor circuit in an initialization operation 1, according to the third exemplary embodiment.

In addition, the switching element SWC1-A of the comparator 52 is turned ON (see FIG. 18). Hence, the capacitor C1 is charged by the difference between the voltage of signal line Lih and the self-threshold voltage Vx (signal line Lih–self-threshold voltage Vx). In the present exemplary embodiment, the voltage value of signal line Lih=the voltage of signal line Vn+1. Therefore, the capacitor C1 is charged by the difference between the voltage of signal line Vn+1 and the self-threshold voltage Vx (signal line Vn+1–self-threshold voltage Vx).

The switching element SWC1-B of the comparator 52 is turned ON (see FIG. 18), and then initialization operation 1 ends. The capacitor C2 is charged by the difference between the voltage of signal line Lil and the self-threshold voltage Vx (signal line Lil–self-threshold voltage Vx). In the present exemplary embodiment, the voltage value of signal line Lil=the voltage of signal line Vn−1. Therefore, the capacitor C2 is charged by the difference between the voltage of signal line Vn−1 and the self-threshold voltage Vx (signal line Vn−1 -self-threshold voltage Vx).

As a result of this initialization operation 1, the capacitor C1 is charged by the difference between the voltage of signal line Vn+1 and the self-threshold voltage Vx (signal line Vn+1–self-threshold voltage Vx), and the capacitor C2 is charged by the difference between the voltage of signal line Vn−1 and the self-threshold voltage Vx (signal line Vn+1 -self-threshold voltage Vx).

Next, comparison operation 1-1 (step 702 in FIG. 17) is described. Comparison operation 1-1 of the present exemplary embodiment is substantially the same as comparison operation 1 of the second exemplary embodiment (see FIG. 12), and therefore description regarding a flowchart will be omitted.

In comparison operation 1-1, the switching element SW3L of the signal line L being detected is turned ON. In the specific example, the switching element SW3Ln is turned ON (see FIG. 19). Thus, the voltage adjustment section ILn is connected to the signal line Ln. As a result, the potential of the signal line Ln is pulled down by the voltage adjustment section ILn, and a line break detection current is drawn.

Figure 19:
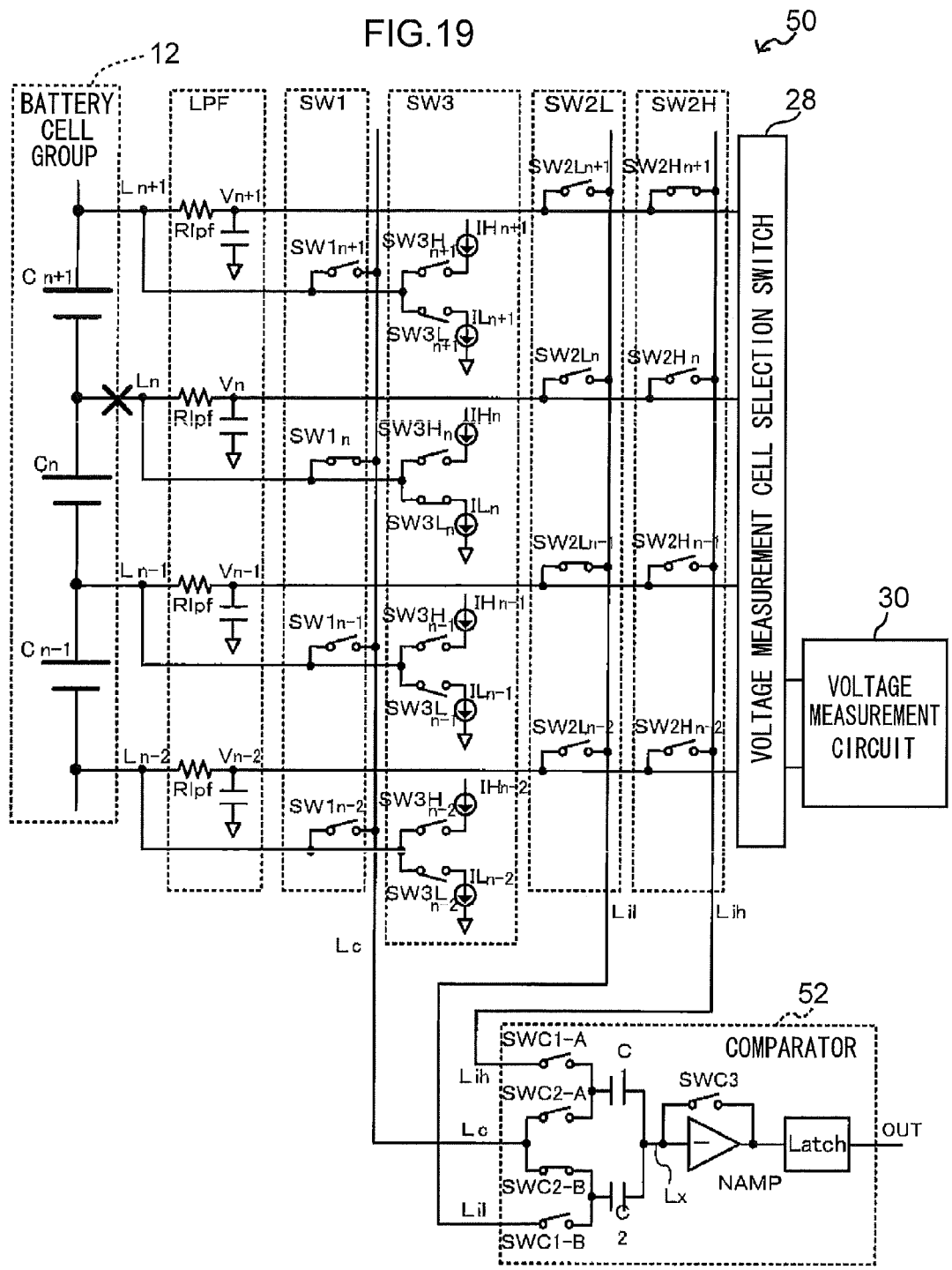
FIG. 19 is a circuit diagram illustrating a state of the semiconductor circuit in a comparison operation 1-1, according to the third exemplary embodiment.

The switching element SWC3 of the comparator 52 is turned OFF (see FIG. 19). As a result, the potential of the input Lx of the single-sided inverting amplifier NAMP goes into a high-impedance state, and the charges at the capacitors C1 and C2 that were charged in the above-described initialization operation are preserved.

The switching element SWC1-A of the comparator 52 is turned OFF, the switching element SWC1-B is turned OFF and the switching element SWC2-B is turned ON. If the voltage of the input signal line Lx at this time is denoted as voltage Vx', the following expression applies.

voltage $Vx'$=signal line $Lc$−(signal line $Vn−1$−self-threshold voltage $Vx$) (13)

Therefore, the following expression applies.

voltage $Vx'$−self-threshold voltage $Vx$=signal line $Lc$−signal line $Vn−1$ (14)

Now, if the output voltage of the single-sided inverting amplifier NAMP is denoted as Vnampout and the gain is denoted as Gnamp, the following expression (15) applies.

output voltage $Vn$ampout=−gain $Gn$amp×(Voltage $Vx'$−self-threshold voltage $Vx$) (15)

If the gain Gnamp is sufficiently high, the output logic of the single-sided inverting amplifier NAMP is determined by whether (voltage Vx'−self-threshold voltage Vx) is positive or negative.

When there is no break in the signal line Ln, the current (voltage) that is drawn from the signal line Ln by the voltage adjustment section ILn is supplied from the cell C. Therefore, the voltage of signal line Lc is the voltage of signal line Ln, unaltered. Therefore, expression (16) applies.

$$\text{voltage } Vx'-\text{self-threshold voltage } Vx=(\text{signal line } Ln-\text{signal line } Vn-1)>0 \quad (16)$$

Therefore, the output OUT of the comparator 52 is at the low level.

On the other hand, if the signal line Ln is broken, the signal line Lc is connected with the signal line Vn via the LPF. If the resistance of the LPF is denoted as Rlpf, the voltage of the signal line Lc through which the line break detection current is drawn is as in expression (17).

$$\text{signal line } Lc=\text{signal line } Vn-\text{current of voltage adjustment section } IL \times \text{resistance } Rlpf \quad (17)$$

If the line break detection current has been specified so as to satisfy the relationship in the following expression (18), then expression (19) applies and the output OUT of the comparator 52 is at the high level.

$$\text{line break detection current} \times \text{resistance } Rlpf>\text{signal line } Vn-\text{signal line } Vn-1(=\text{battery voltage of cell } C) \quad (18)$$

$$\text{voltage } Vx'-\text{self-threshold voltage } Vx=(\text{signal line } Lc-\text{signal line } Vn-1)<0 \quad (19)$$

Then, the output OUT outputted by the comparator 52 is detected, and it is determined whether the output OUT is at the high level or the low level. If it is at the low level, as described above, it is detected that there is no line break and comparison operation 1-1 ends. On the other hand, if it is at the high level, as described above, it is detected that a line break exists. When there is a line break, specific measures are taken, after which comparison operation 1-1 ends.

Thus, in comparison operation 1-1, the output OUT is at the low level when there is no line break and the output OUT is at the high level when there is a line break.

Next, comparison operation 1-2 (step 704 in FIG. 17) is described. Comparison operation 1-2 of the present exemplary embodiment is substantially the same as comparison operation 2 of the second exemplary embodiment (see FIG. 12), so there is no description of a flowchart. Note that, similarly to the second exemplary embodiment, this description is given with comparison operation 1-2 following on from comparison operation 1-1.

Figure 20:
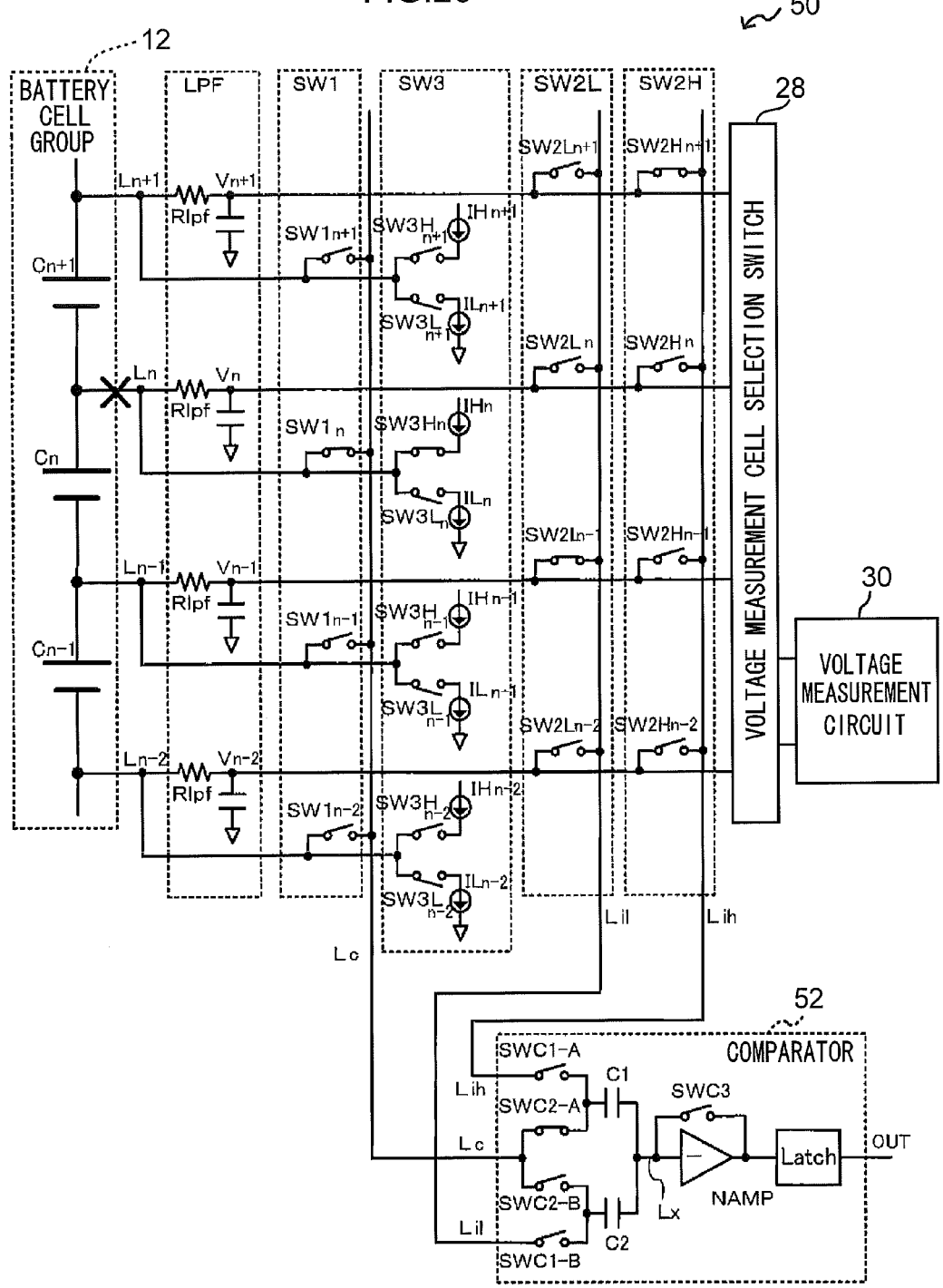
FIG. 20 is a circuit diagram illustrating a state of the semiconductor circuit in a comparison operation 1-2, according to the third exemplary embodiment.

In comparison operation 1-2, the switching element SW3L of the signal line L being detected (the switching element SW3Ln) and the switching element SWC2-B of the comparator 52 are turned ON (see FIG. 20).

The switching element SW3H of the signal line L being detected is turned ON. In the specific example, the switching element SW3Hn is turned ON (see FIG. 20). Thus, the voltage adjustment section IHn is connected to the signal line Ln. As a result, the potential of the signal line Ln is pulled up by the voltage adjustment section IHn, and a line break detection current is supplied.

The switching element SWC2-A of the comparator 52 is turned OFF. If the voltage of the input signal line Lx at this time is denoted as voltage Vx', the following expression applies.

$$\text{voltage } Vx'=\text{signal line } Lc-(\text{signal line } Vn+1-\text{self-threshold voltage } Vx) \quad (20)$$

Therefore, the following expression applies.

$$\text{voltage } Vx'-\text{self-threshold voltage } Vx=\text{signal line } Lc-\text{signal line } Vn+1 \quad (21)$$

When there is no break in the signal line Ln, the current (voltage) that is supplied to the signal line Ln by the voltage adjustment section IHn flows to the cell C. Therefore, the voltage of signal line Lc is the voltage of signal line Ln, unaltered. Therefore, expression (22) applies.

$$\text{voltage } Vx'-\text{self-threshold voltage } Vx=(\text{signal line } Ln-\text{signal line } Vn+1)<0 \quad (22)$$

Therefore, the output OUT of the comparator 52 is at the high level.

On the other hand, if the signal line Ln is broken, the signal line Lc is connected to the signal line Vn via the LPF. If the resistance of the LPF is denoted as Rlpf, the voltage of the signal line Lc through which the line break detection current is supplied is as in expression (23).

$$\text{signal line } Lc=\text{signal line } Vn+\text{current of voltage adjustment section } IH \times \text{resistance } Rlpf \quad (23)$$

If the line break detection current has been specified so as to satisfy the relationship in the following expression (24), then expression (25) applies and the output OUT of the comparator 52 is at the low level.

$$\text{line break detection current} \times \text{resistance } Rlpf>\text{signal line } Vn-\text{signal line } Vn+1(=\text{battery voltage of cell } Cn+1) \quad (24)$$

$$\text{voltage } Vx'-\text{self-threshold voltage } Vx=(\text{signal line } Lc-\text{signal line } Vn+1)>0 \quad (25)$$

Then, the output OUT outputted by the comparator 52 is detected, and it is determined whether the output OUT is at the high level or the low level. If it is at the high level, as described above, it is detected that there is no line break and comparison operation 1-2 ends. On the other hand, if it is low, as described above, it is detected that a line break exists. When there is a line break, specific measures are taken, after which comparison operation 1 -2 ends.

Thus, in comparison operation 1-2, the output OUT is at the high level when there is no line break and the output OUT is at the low level when there is a line break.

In the present exemplary embodiment, after comparison operations 1-1 and 1-2, comparison operation 2 and comparison operation 3 are also carried out. Before comparison operation 2, firstly, an initialization operation 2 is carried out for charging up the capacitors C1 and C2 of the comparator 52 with charges that are required for comparison operation 2.

Figure 21:
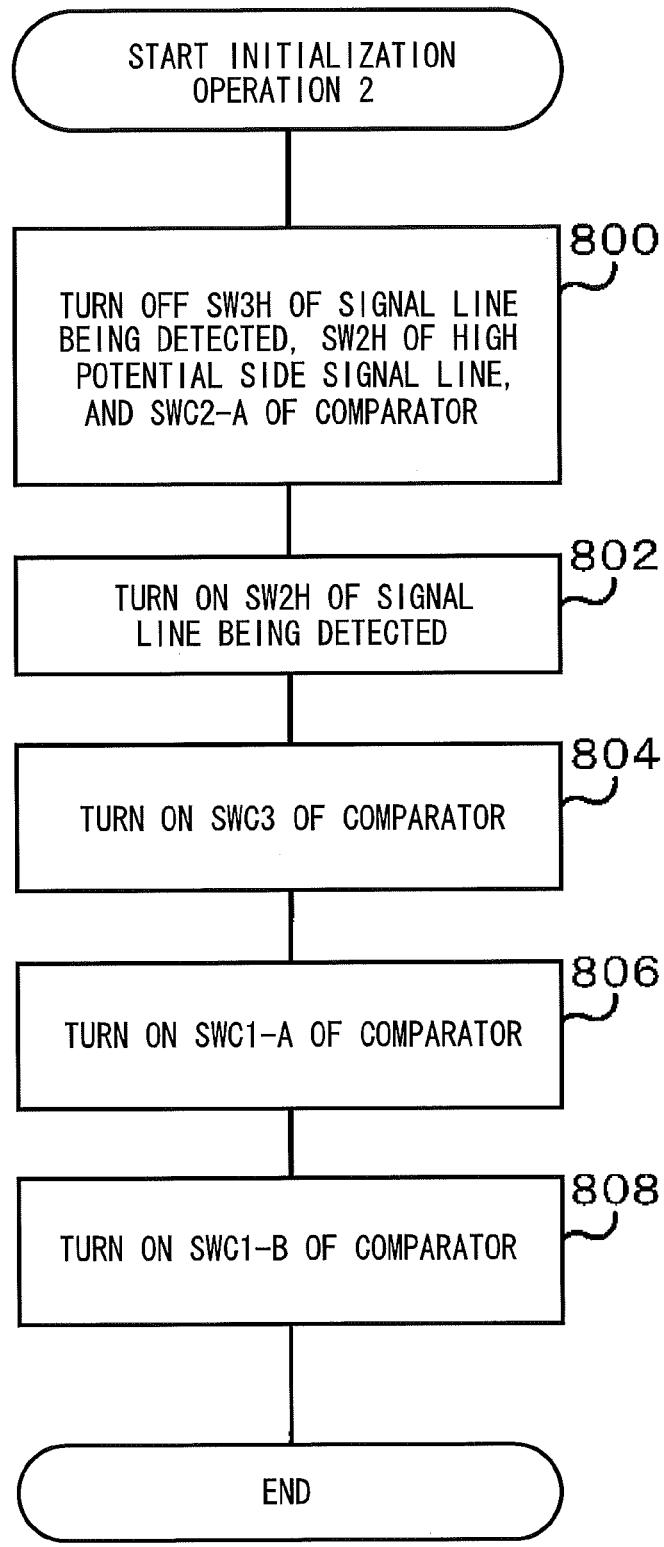
FIG. 21 is a flowchart showing a flow of an initialization operation 2 according to the third exemplary embodiment.

FIG. 21 shows a flowchart of an example of flow of initialization operation 2 of the present exemplary embodiment (step 706 in FIG. 17). Note that the description is given with initialization operation 2 following on from comparison operation 1-2.

In step 800, the switching element SW3H of the signal line L being detected, the switching element SW2H of the signal line V at the high potential side and the switching element SWC2-A of the comparator 52 are turned OFF. In the specific example, the switching element SW3Hn, the switching element SW2Hn+1 and the switching element SWC2-A are turned OFF (see FIG. 22).

Then, in step 802, the switching element SW2H of the signal line V being detected is turned ON. In the specific example, the switching element SW2Hn is turned ON (see FIG. 22).

In step 804, the switching element SWC3 of the comparator 52 is turned ON. As a result, the voltage of the input signal line Lx of the single-sided inverting amplifier NAMP of the comparator 52 reaches the self-threshold voltage Vx of the single-sided inverting amplifier NAMP.

Figure 22:
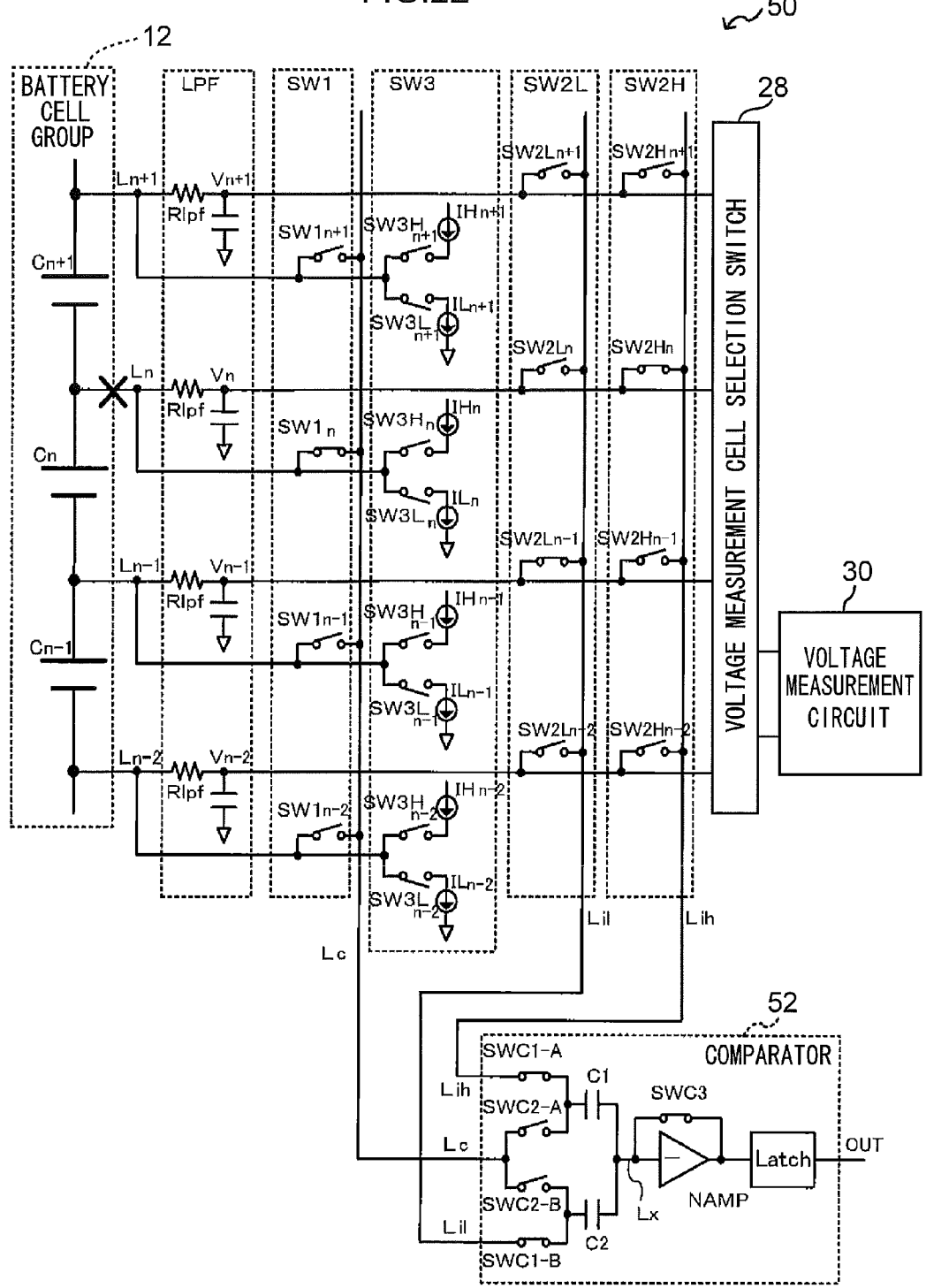
FIG. 22 is a circuit diagram illustrating a state of the semiconductor circuit in initialization operation 2, according to the third exemplary embodiment.

In step 806, the switching element SWC1-A of the comparator 52 is turned ON (see FIG. 22). Hence, the capacitor C1 is charged by the difference between the voltage of signal line Vn and the self-threshold voltage Vx (signal line Vn–self-threshold voltage Vx).

In step 808, the switching element SWC1-B of the comparator 52 is turned ON (see FIG. 22), and then initialization operation 2 ends. The capacitor C2 is charged by the difference between the voltage of signal line Vn−1 and the self-threshold voltage Vx (signal line Vn−1–self-threshold voltage Vx).

As a result of this initialization operation 2, the capacitor C1 is charged by the difference between the voltage of signal line Vn and the self-threshold voltage Vx (signal line Vn–self-threshold voltage Vx), and the capacitor C2 is charged by the difference between the voltage of signal line Vn−1 and the self-threshold voltage Vx (signal line Vn−1 –self-threshold voltage Vx).

Figure 23:
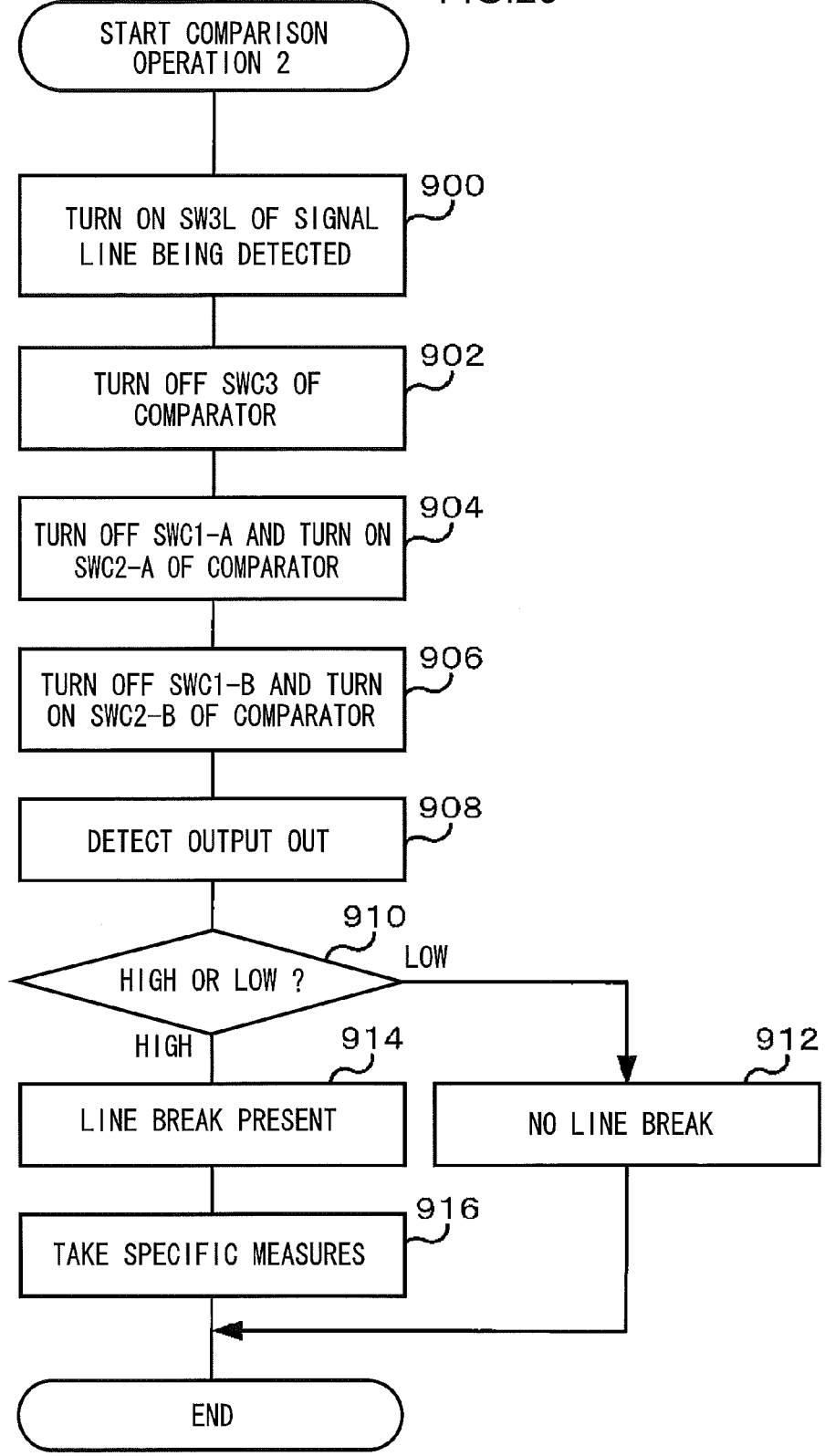
FIG. 23 is a flowchart showing a flow of a comparison operation 2 according to the third exemplary embodiment.

Next, following on from initialization operation 2, comparison operation 2 (step 308 in FIG. 17) is described. FIG. 23 shows a flowchart of an example of flow of comparison operation 2 of the present exemplary embodiment.

In step 900, the switching element SW3L of the signal line L being detected is turned ON. In the specific example, the switching element SW3Ln is turned ON (see FIG. 24). Thus, the voltage adjustment section ILn is connected to the signal line Ln. As a result, the potential of the signal line Ln is pulled down by the voltage adjustment section ILn, and the line break detection current is drawn.

Figure 24:
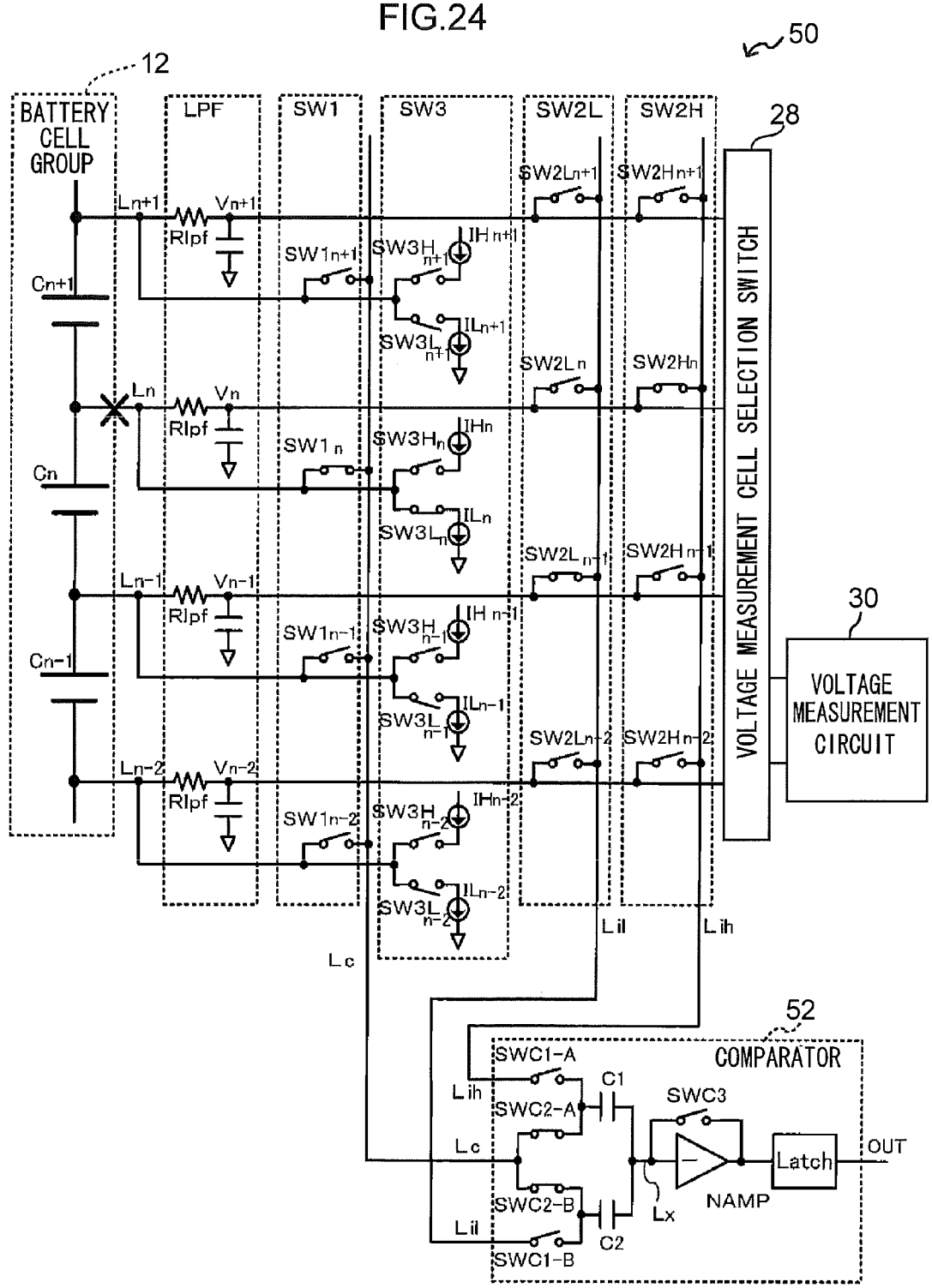
FIG. 24 is a circuit diagram illustrating a state of the semiconductor circuit in comparison operation 2, according to the third exemplary embodiment.

Then, in step 902, the switching element SWC3 of the comparator 52 is turned OFF (see FIG. 24). As a result, the voltage of the input Lx of the single-sided inverting amplifier NAMP turns to a high-impedance state, and the charges at the capacitors C1 and C2 that were charged in the above-described initialization operation 2 are preserved.

In step 904, the switching element SWC1-A of the comparator 52 is turned OFF and the switching element SWC2-A is turned ON. Then, in step 906, the switching element SWC1-B of the comparator 52 is turned OFF and the switching element SWC2-B is turned ON. If the charge of the capacitor C1 at this time is denoted as charge Q1 and the capacitance is denoted as capacitance C1, and the charge of the capacitor C2 at this time is denoted as charge Q2 and the capacitance is denoted as capacitance C2, the charges Q1 and Q2 are expressed by the following expressions (26) and (27).

charge $Q1$=capacitance–(signal line $Vn$–self-threshold voltage $Vx$) (26)

charge $Q2$=capacitance $C2$(signal line $Vn-1$–self-threshold voltage $Vx$) (27)

If the voltage of the input signal line Lx is denoted as voltage Vx', from the combined capacitance of the capacitors C1 and C2, the following expression (28) applies.

(capacitance $C1$+capacitance $C2$)voltage $Vx'$=capacitance $C1$(signal line $Vn$–self-threshold voltage $Vx$)+capacitance $C2$(signal line $Vn-1$–self-threshold voltage $Vx$) (28)

Therefore, the following expression (29) applies.

voltage $Vx'$–self-threshold voltage $Vx$=(signal line $Lc$–signal line $Vn-1$)–capacitance $C1$/(capacitance $C1$+capacitance $C2$)×(signal line $Vn$–signal line $Vn-1$) (29)

As mentioned above, if the gain Gnamp is sufficiently high, the output logic of the single-sided inverting amplifier NAMP is determined by whether (voltage Vx'–self-threshold voltage Vx) is positive or negative.

When there is no break in the signal line Ln, the current (voltage) that is drawn from the signal line Ln by the voltage adjustment section ILn is supplied from the cell C. Therefore, the voltage of signal line Lc is the voltage of signal line Ln, unaltered. Therefore, expression (30) applies.

voltage $Vx'$–self-threshold voltage $Vx$=(signal line $Lc$–signal line $Vn-1$)–capacitance $C1$/(capacitance $C1$+capacitance $C2$)×(signal line $Vn$–signal line $Vn-1$)>0 (30)

Therefore, the output OUT of the comparator 42 is at the low level.

On the other hand, if the signal line Ln is broken, the signal line Lc is connected to the signal line Vn via the LPF. If the resistance of the LPF is denoted as Rlpf, the voltage of the signal line Lc through which the line break detection current is drawn is as in expression (31).

signal line $Lc$=signal line $Vn$–line break detection current×resistance $Rlpf$ (31)

If the line break detection current has been specified so as to satisfy the relationship in the following expression (32), then expression (33) applies and the output OUT of the comparator 52 is at the high level.

line break detection current×resistance $Rlpf$>(signal line $Lc$–signal line $Vn-1$)–capacitance $C1$/(capacitance $C1$+capacitance $C2$)×(signal line $Vn$–signal line $Vn-1$)(=battery voltage of cell $Cn$×capacitance $C1$/(capacitance $C1$+capacitance $C2$)) (32)

voltage $Vx'$–self-threshold voltage $Vx$=(signal line $Lc$–signal line $Vn-1$)–capacitance $C1$/(capacitance $C1$+capacitance $C2$)×(signal line $Vn$–signal line $Vn-1$)<0 (33)

Then, in step 908, the output OUT outputted by the comparator 52 is detected, and in step 910 it is determined whether the output OUT is at the high level or the low level. If it is at the low level, the operation proceeds to step 912 and, as described above, it is detected that there is no line break and comparison operation 2 ends. On the other hand, if it is high, the operation proceeds to step 914 and, as described above, it is detected that a line break exists. When there is a line break, the operation proceeds to step 916 and specific measures are taken, after which comparison operation 2 ends.

Thus, in comparison operation 2, the output OUT is at the low level when there is no line break and the output OUT is at the high level when there is a line break.

In the present exemplary embodiment, comparison operation 3 follows on from comparison operation 2. Before comparison operation 3, firstly, initialization operation 3 is carried out for charging up the capacitors C1 and C2 of the comparator 52 with charges that are required for comparison operation 3.

Figure 25:
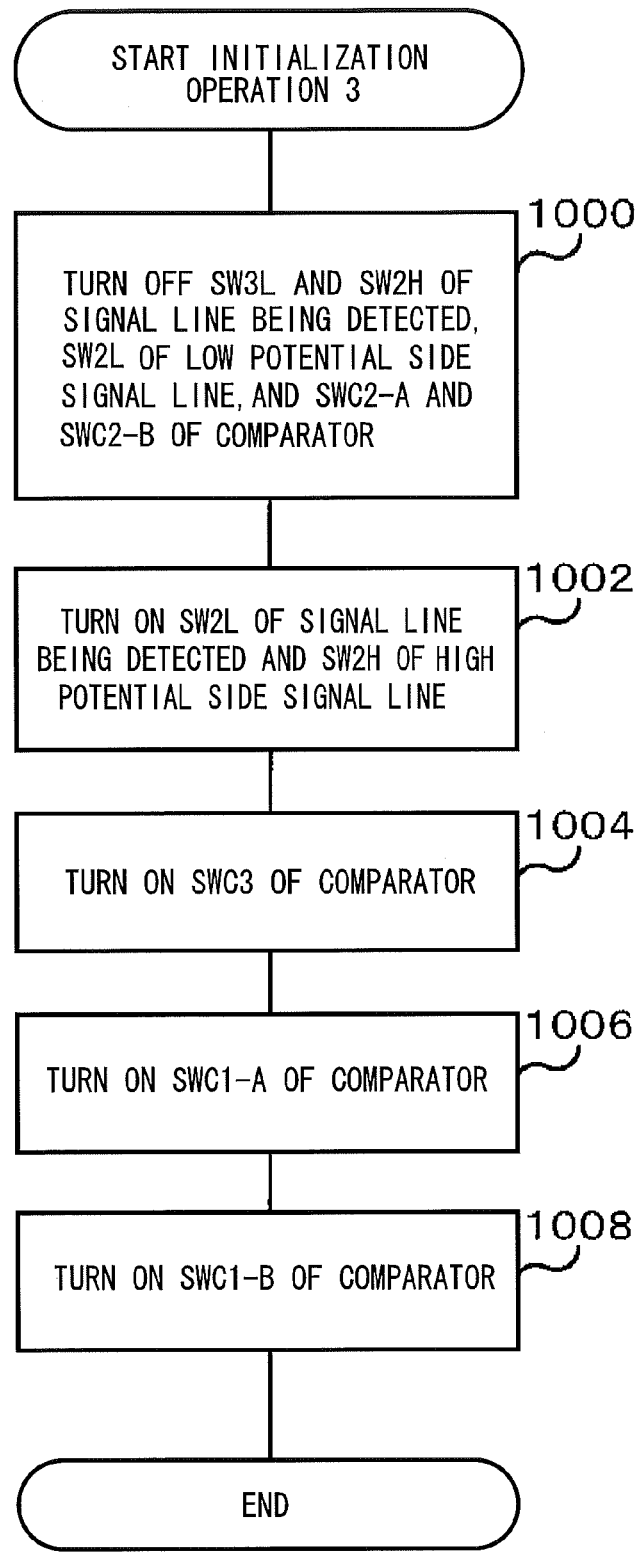
FIG. 25 is a flowchart showing a flow of an initialization operation 3 according to the third exemplary embodiment.

FIG. 25 shows a flowchart of an example of flow of initialization operation 3 of the present exemplary embodiment (step 710 in FIG. 17). Note that the description is given with initialization operation 3 following on from comparison operation 2.

In step 1000, the switching element SW3L of the signal line L being detected, the switching element SW2L of the signal line V at the low potential side and the switching elements SWC2-A and SWC2-B of the comparator 52 are turned OFF. In the specific example, the switching element SW3Ln, the switching element SW2Ln−1 and the switching elements SWC2-A and SWC2-B are turned OFF (see FIG. 26).

Then, in step 1002, the switching element SW2L of the signal line V to be detected and the switching element SW2H of the signal line V at the high potential side are turned ON. In the specific example, the switching element SW2Ln and the switching element SW2Hn+1 are turned ON (see FIG. 26).

Then, in step 1004, the switching element SWC3 of the comparator 52 is turned ON. As a result, the voltage of the input signal line Lx of the single-sided inverting amplifier NAMP of the comparator 52 reaches the self-threshold voltage Vx of the single-sided inverting amplifier NAMP.

Figure 26:
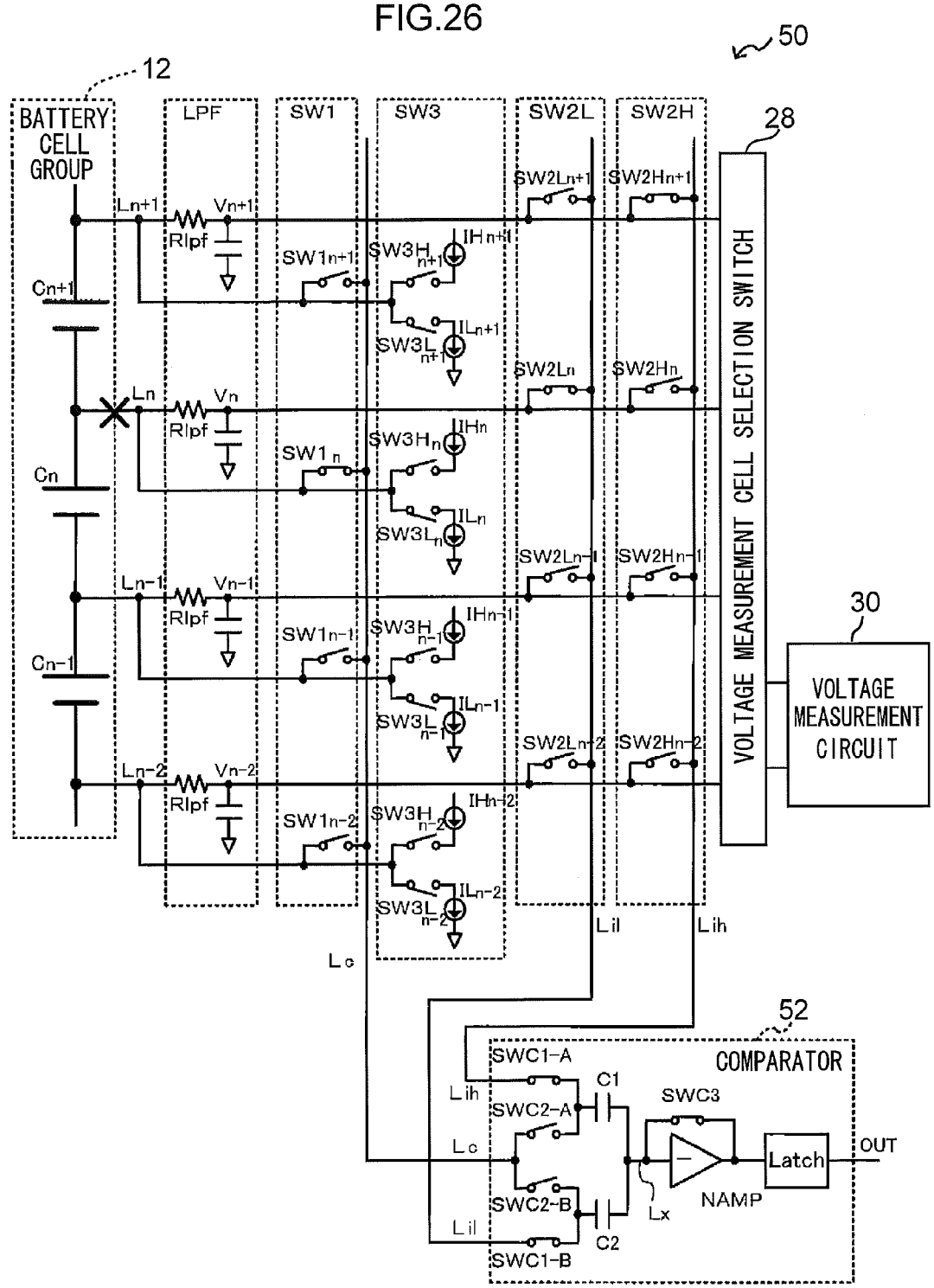
FIG. 26 is a circuit diagram illustrating a state of the semiconductor circuit in initialization operation 3, according to the third exemplary embodiment.

In step 1006, the switching element SWC1-A of the comparator 52 is turned ON (see FIG. 26). Hence, the capacitor C1 is charged by the difference between the voltage of signal line Vn+1 and the self-threshold voltage Vx (signal line Vn+1−self-threshold voltage Vx).

In step 1008, the switching element SWC1-B of the comparator 52 is turned ON (see FIG. 26), and then initialization operation 3 ends. The capacitor C2 is charged by the difference between the voltage of signal line Vn and the self-threshold voltage Vx (signal line Vn−self-threshold voltage Vx).

As a result of this initialization operation 3, the capacitor C1 is charged by the difference between the voltage of signal line Vn+1 and the self-threshold voltage Vx (signal line Vn+1−self-threshold voltage Vx), and the capacitor C2 is charged by the difference between the voltage of signal line Vn and the self-threshold voltage Vx (signal line Vn−self-threshold voltage Vx).

Figure 27:
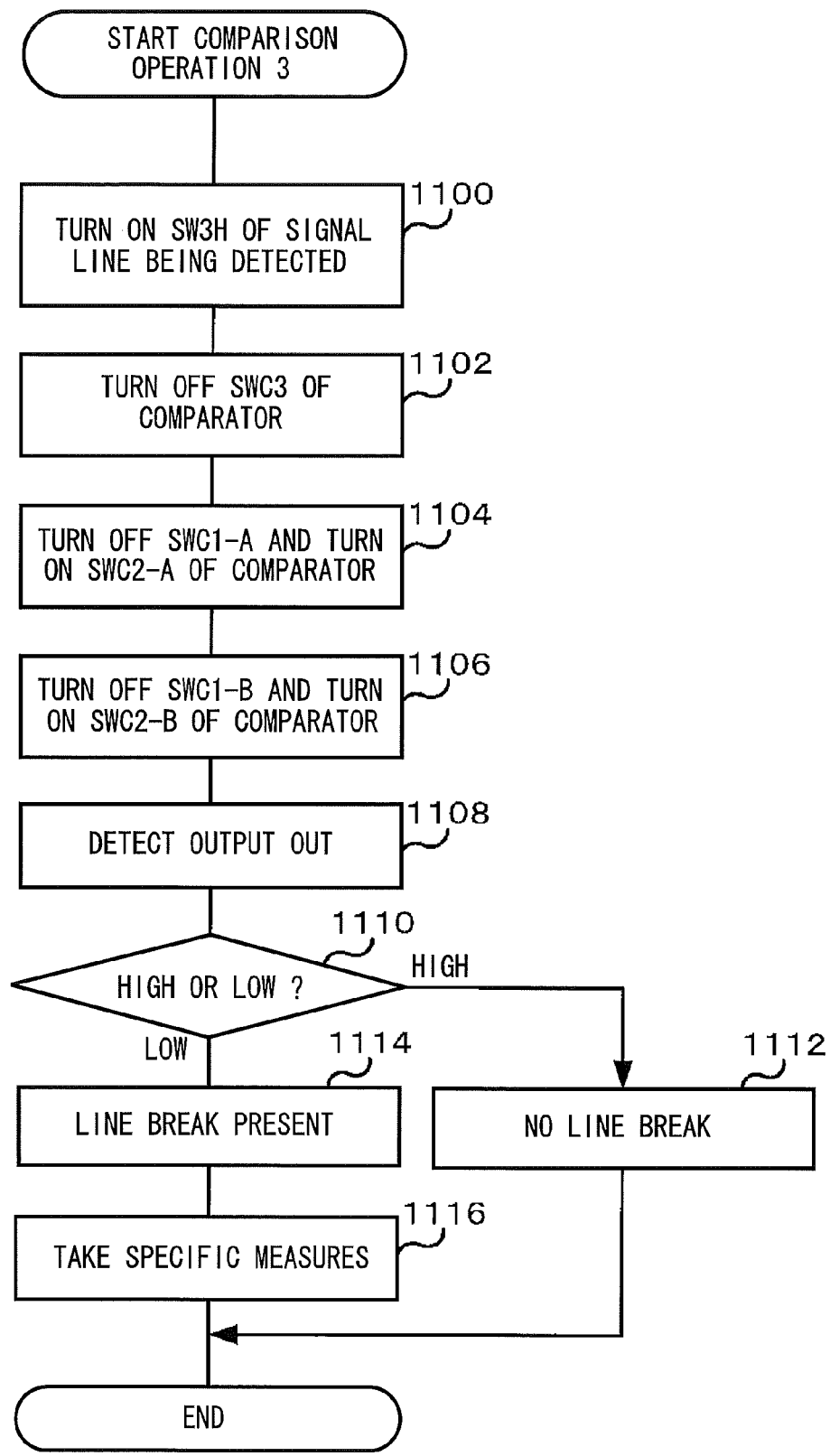
FIG. 27 is a flowchart showing a flow of a comparison operation 3 according to the third exemplary embodiment.

Next, following on from initialization operation 3, comparison operation 3 (step 712 in FIG. 17) is described. FIG. 27 shows a flowchart of an example of flow of comparison operation 3 of the present exemplary embodiment.

In step 1100, the switching element SW3H of the signal line L being detected is turned ON. In the specific example, the switching element SW3Hn is turned ON (see FIG. 28). Thus, the voltage adjustment section IHn is connected to the signal line Ln. As a result, the potential of the signal line Ln is pulled up by the voltage adjustment section IHn, and the line break detection current is supplied.

Figure 28:
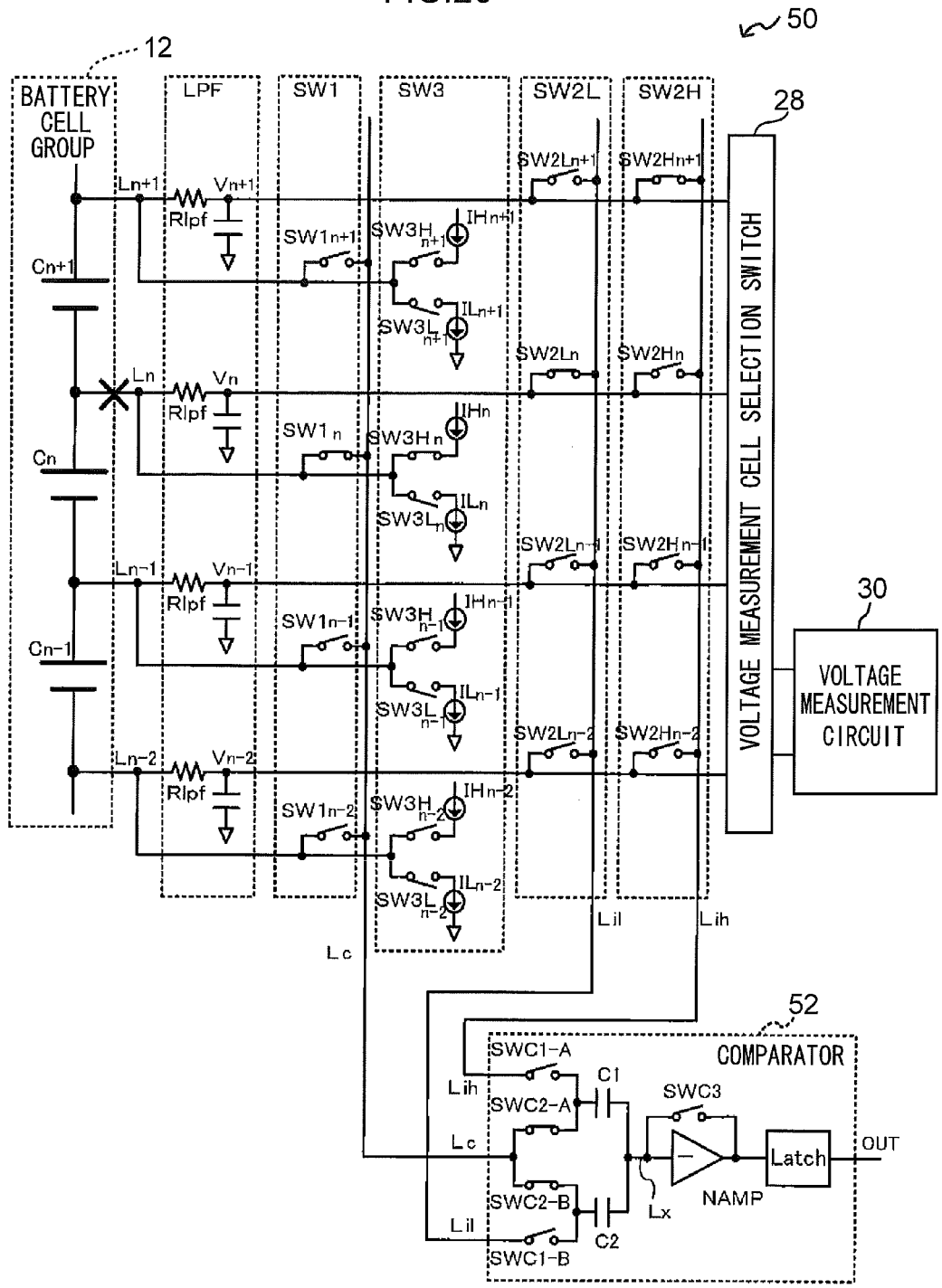
FIG. 28 is a circuit diagram illustrating a state of the semiconductor circuit in comparison operation 3, according to the third exemplary embodiment.

Then, in step 1102, the switching element SWC3 of the comparator 52 is turned OFF (see FIG. 28). As a result, the voltage of the input Lx of the single-sided inverting amplifier NAMP turns to a high-impedance state, and the charges at the capacitors C1 and C2 that were charged in the above-described initialization operation 3 are preserved.

In step 1104, the switching element SWC1-A of the comparator 52 is turned OFF and the switching element SWC2-A is turned ON. Then, in step 1106, the switching element SWC1-B of the comparator 52 is turned OFF and the switching element SWC2-B is turned ON. The same as described above, if the charge of the capacitor C1 is denoted as charge Q1 and the capacitance is denoted as capacitance C1, and the charge of the capacitor C2 is denoted as charge Q2 and the capacitance is denoted as capacitance C2, the charges Q1 and Q2 are expressed by the following expressions (34) and (35).

$$\text{charge } Q1 = \text{capacitance } C1(\text{signal line } Vn+1-\text{self-threshold voltage } Vx) \quad (34)$$

$$\text{charge } Q2 = \text{capacitance } C2(\text{signal line } Vn-\text{self-threshold voltage } Vx) \quad (35)$$

If the voltage of the input signal line Lx is denoted as voltage Vx', from the combined capacitance of the capacitors C1 and C2, the following expression (36) applies.

$$(\text{capacitance } C1+\text{capacitance } C2)\text{voltage } Vx' = \text{capacitance } C1(\text{signal line } Vn+1-\text{self-threshold voltage } Vx)+\text{capacitance } C2(\text{signal line } Vn-\text{self-threshold voltage } Vx) \quad (36)$$

Therefore, the following expression (37) applies.

$$\text{voltage } Vx'-\text{self-threshold voltage } Vx = (\text{signal line } Lc-\text{signal line } Vn)-\text{capacitance } C1/(\text{capacitance } C1+\text{capacitance } C2)\times(\text{signal line } Vn+1-\text{signal line } Vn) \quad (37)$$

As mentioned above, if the gain Gnamp is sufficiently high, the output logic of the single-sided inverting amplifier NAMP is determined by whether (voltage Vx'−self-threshold voltage Vx) is positive or negative.

When there is no break in the signal line Ln, the current (voltage) that is supplied to the signal line Ln from the voltage adjustment section IHn flows into the cell C. Therefore, the voltage of signal line Lc is the voltage of signal line Ln, unaltered. Therefore, expression (38) applies.

$$\text{voltage } Vx'-\text{self-threshold voltage } Vx = (\text{signal line } Lc-\text{signal line } Vn)-\text{capacitance } C1/(\text{capacitance } C1+\text{capacitance } C2)\times(\text{signal line } Vn+1-\text{signal line } Vn-1)<0 \quad (38)$$

Therefore, the output OUT of the comparator 52 is at the high level.

On the other hand, if the signal line Ln is broken, the signal line Lc is connected to the signal line Vn via the LPF. If the resistance of the LPF is denoted as Rlpf, the voltage of the signal line Lc through which the line break detection current is drawn is as in expression (39).

$$\text{signal line } Lc = \text{signal line } Vn + \text{line break detection current}\times\text{resistance } Rlpf \quad (39)$$

If the line break detection current has been specified so as to satisfy the relationship in the following expression (40), then expression (41) applies and the output OUT of the comparator 52 is at the low level.

$$\text{line break detection current}\times\text{resistance } Rlpf > \text{capacitance } C1/(\text{capacitance } C1+\text{capacitance } C2)\times(\text{signal line } Vn+1-\text{signal line } Vn) \\ (=\text{battery voltage of cell } Cn+1\times\text{capacitance } C1/(\text{capacitance } C1+\text{capacitance } C2)) \quad (40)$$

$$\text{voltage } Vx'-\text{self-threshold voltage } Vx = (\text{signal line } Lc-\text{signal line } Vn)-\text{capacitance } C1/(\text{capacitance } C1+\text{capacitance } C2)\times(\text{signal line } Vn+1-\text{signal line } Vn)>0 \quad (41)$$

Then, in step 1108, the output OUT outputted by the comparator 52 is detected, and in step 1110 it is determined whether the output OUT is at the high level or the low level. If it is high, the operation proceeds to step 1112 and, as described above, it is detected that there is no line break and comparison operation 3 ends. On the other hand, if it is low, the operation proceeds to step 1114 and, as described above, it is detected that a line break exists. When there is a line break, the operation proceeds to step 1116 and specific measures are taken, after which comparison operation 3 ends.

Thus, in comparison operation 3, the output OUT is at the high level when there is no line break and the output OUT is at the low level when there is a line break.

Thus, as described above, output OUT results in the present exemplary embodiment are as in table 3.

TABLE 3

|  | Comparison operation 1-1 | Comparison operation 1-2 | Comparison operation 2 | Comparison operation 3 |
|---|---|---|---|---|
| No line break | Low | High | Low | High |
| Line break present | High | Low | High | Low |

As described above, the semiconductor circuit 50 of the present exemplary embodiment, when carrying out line break detection of a signal line Ln, charges up the capacitor C1 of the comparator 52 with the difference between the voltage of signal line Vn+1 and the self-threshold voltage Vx (signal line Vn+1−self-threshold voltage Vx) and charges up the capacitor C2 with the difference between the voltage of signal line Vn−1 and the self-threshold voltage Vx (signal line Vn−1−self-threshold voltage Vx) by initialization operation 1. In comparison operation 1-1, the line break detection current is drawn from the signal line Ln by the voltage adjustment section ILn, and the signal line Lc is connected with the capacitor C1. The semiconductor circuit 50 of the present exemplary embodiment detects that there is no line break if the output OUT is at the low level and detects that there is a line break if the output OUT is at the high level. In comparison operation 1-2, the line break detection current is supplied to the signal line Ln by the voltage adjustment section IHn and the signal line Lc is connected with the capacitor C2, and the semiconductor circuit 50 of the present exemplary embodiment detects that there is no line break if the output OUT is at the high level and detects that there is a line break if the output OUT is at the low level.

In addition, the present exemplary embodiment charges up the capacitor C1 of the comparator 52 with the difference between the voltage of signal line Vn and the self-threshold voltage Vx (signal line Vn−self-threshold voltage Vx) and charges up the capacitor C2 with the difference between the voltage of signal line Vn−1 and the self-threshold voltage Vx (signal line Vn−1−self-threshold voltage Vx) by initialization operation 2. In comparison operation 2, the line break detection current is drawn from the signal line Ln by the voltage adjustment section ILn, and the signal line Lc is connected with the capacitors C1 and C2. The present exemplary embodiment detects that there is no line break if the output OUT is at the low level and detects that there is a line break if the output OUT is at the high level.

Furthermore, the present exemplary embodiment charges up the capacitor C1 of the comparator 52 with the difference between the voltage of signal line Vn+1 and the self-threshold voltage Vx (signal line Vn+1−self-threshold voltage Vx) and charges up the capacitor C2 with the difference between the voltage of signal line Vn and the self-threshold voltage Vx (signal line Vn−self-threshold voltage Vx) by initialization operation 3. In comparison operation 3, the line break detection current is supplied to the signal line Ln by the voltage adjustment section IHn, and the signal line Lc is connected with the capacitors C1 and C2. The present exemplary embodiment detects that there is no line break if the output OUT is at the high level and detects that there is a line break if the output OUT is at the low level.

The semiconductor circuit 50 of this present exemplary embodiment is provided such that the switching element SW1 connects the signal line Lc with the signal line L at the side preceding the LPF, which is a position at which a line break is to be detected. Furthermore, the present exemplary embodiment is provided such that the switching element SW2L connects the signal line V at the side succeeding the LPF with the signal line Lil and the switching element SW2H connects the signal line V at the side succeeding the LPF with the signal line Lih. Moreover, the present exemplary embodiment is configured such that the switching element SW3H connects the signal line L with the voltage adjustment section IH and the switching element SW3L connects the signal line L with the voltage adjustment section IL.

Therefore, in the semiconductor circuit 50 equipped with the LPFs, line breaks of the signal lines L between the battery cell group 12 and the LPFs (before the LPFs) can be properly detected.

The same advantageous effects as in the above-described second exemplary embodiment are provided.

That is, the voltage adjustment sections IH and IL are not always connected to the signal lines L but connected to the signal lines L only in periods of line break detection. Therefore, in the present exemplary embodiment, currents are not always flowing from the voltage adjustment sections IH and IL, and currents during standby (dark currents) are not produced.

Furthermore, the line break detection currents may be specified so as to satisfy the relationship mentioned above. Therefore, in the present exemplary embodiment, a discharge current when the cells C are short-circuited by a switching element may be small. Thus, the present exemplary embodiment may not cause variations in battery voltages of the cells C.

In the present exemplary embodiment, line breaks may be properly detected by the comparator 52. Thus, detection of line breaks is implemented without use of the voltage measurement cell selection switch 28 and the voltage measurement circuit 30. Therefore, in the present exemplary embodiment, line break detection may be carried out even during a period of an operation that uses the voltage measurement cell selection switch 28 and the voltage measurement circuit 30 to measure battery voltages of the cells C.

[Fourth Exemplary Embodiment]

Figure 29:
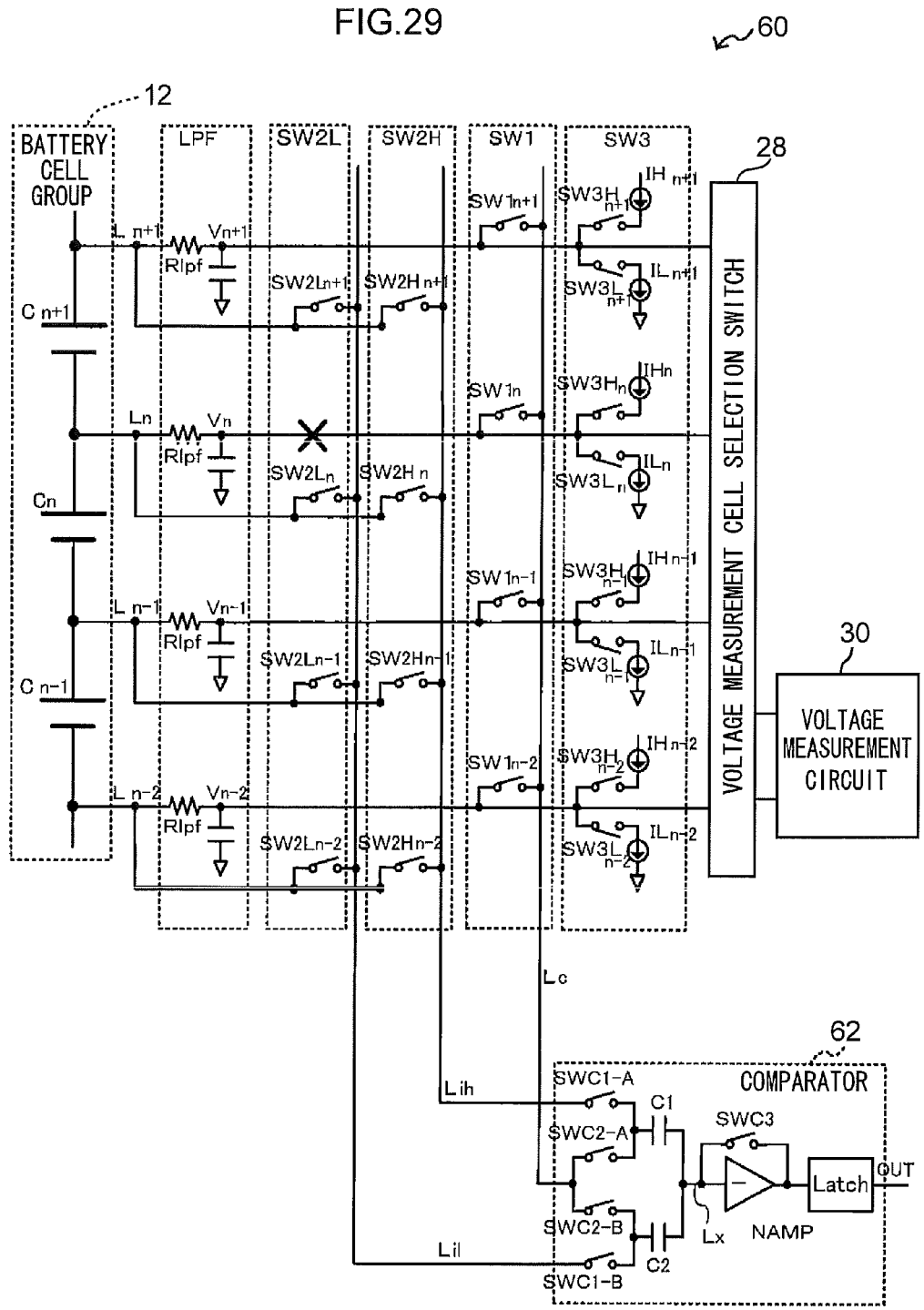
FIG. 29 is a circuit diagram illustrating general configuration of a semiconductor circuit according to a fourth exemplary embodiment.

In the third exemplary embodiment, the semiconductor circuit 50 for detecting line breaks of the signal lines L between the battery cell group 12 and the LPFs (before the LPFs) is described in detail. In contrast, an example of general configuration of a semiconductor circuit 60 for detecting line breaks of the signal lines L between the LPFs and the voltage measurement cell selection switch 28 (i.e., the signal lines V after the LPFs) is illustrated in FIG. 29.

The semiconductor circuit 60 of the present exemplary embodiment detects line breaks of each signal line V between the LPF and the voltage measurement cell selection switch 28. Accordingly the semiconductor circuit 60 is configured such that a switching element SW1 connects the signal line V with the signal line Lc, a switching element SW3H connects such that the line break detection current from the voltage adjustment section IH is supplied to the signal line V, and a switching element SW3L connects such that the line break detection current is drawn from the signal line V by the voltage adjustment section IL. Furthermore, the semiconductor circuit 60 of the present exemplary embodiment is configurated such that switching elements SW2H and SW2L connect the signal lines Lih and Lil with the signal line L between the battery cell group 12 and the LPF.

A line break detection operation is substantially the same as in the third exemplary embodiment, description thereof will be omitted. Thus, the semiconductor circuit 60 of the present exemplary embodiment may properly detect line breaks of the signal lines L between the LPFs and the voltage measurement cell selection switch 28 (the signal lines V after the LPFs) by similar operations to the third exemplary embodiment.

In the second to fourth exemplary embodiments described above, cases are described in which the respective comparison operations are carried out for one at a time of the signal lines L at which line breaks are to be detected. However, the present invention is not limited thereto. For example, of the respective comparison operations, a comparison operation may be carried out on all the signal lines L and the next comparison operation carried out when that has finished.

In the first to fourth exemplary embodiments described above, cases are described in which line breaks of the signal lines L are detected on the basis of logical values (high/low) of the output OUT at each comparison operation and the specific measures are taken each time a line break of a signal line L is detected. However, the present invention is not limited thereto. For example, logical values of the output OUT for all the signal lines L may be obtained and stored in the memory section 23, the existence or non-existence of line breaks detected on the basis of the logical values of the output OUT stored in the memory section 23 for all the signal lines, and then the specific measures taken. As a further example, the outputs OUT may be stored in the memory section 23 at the comparison operations and, after all the comparison operations have ended, the existence or non-existence of line breaks may be detected on the basis of all the logical values of the output OUT stored in the memory section 23 and then the specific measures may be taken.

The first to fourth exemplary embodiments described above have configurations in which the detection circuit 22 and the memory section 23 are provided inside the semiconductor circuit 14. However, the present invention is not limited thereto. The detection circuit 22 and the memory section 23 may be formed in a separate circuit (in an integrated circuit). Moreover, in the above descriptions, a device that provides line break detection execution instructions to the detection circuit 22 and a device that monitors the logical values stored in the memory section 23 and detects the existence or non-existence of line breaks are external devices. However, configurations are possible in which the external device that detects the existence or non-existence of line breaks is provided in the semiconductor circuit 14.

What is claimed is:

1. A semiconductor circuit comprising:
   a plurality of battery voltage signal lines, each signal line connected to both ends of each of a plurality of batteries that are connected in series;
   a first connection portion, provided at each battery voltage signal line, that connects the battery voltage signal line with a first signal line;
   a second connection portion, provided at each battery voltage signal line, that connects the battery voltage signal line with a second signal line;
   a first voltage supply section, provided at each battery voltage signal line, that supplies the battery voltage signal line with a voltage higher than a voltage at a high potential side of the battery to whose low potential side the battery voltage signal line is connected;
   a second voltage supply section, provided at each battery voltage signal line, that supplies the battery voltage signal line with a voltage lower than a voltage at the low potential side of the battery to whose high potential side the battery voltage signal line is connected; and
   a comparison section that compares a voltage of the first signal line with a voltage of the second signal line, and that outputs a comparison result.

2. The semiconductor circuit according to claim 1, further comprising a third connection portion, provided at each battery voltage signal line, that connects the battery voltage signal line with a third signal line,
   wherein the comparison section also compares the voltage of the first signal line with a voltage of the third signal line and outputs a comparison result.

3. The semiconductor circuit according to claim 2, wherein each second connection portion connects the second signal line to a fourth signal line that is connected to the battery voltage signal line via a frequency cut-off section, and
   the third connection portion connects the third signal line to the fourth signal line.

4. The semiconductor circuit according to claim 2, wherein each first connection portion connects the first signal line to a fourth signal line that is connected to the battery voltage signal line via a frequency cut-off section,
   the first voltage supply section supplies the voltage thereof to the fourth signal line, and
   the second voltage supply section supplies the voltage thereof to the fourth signal line.

5. The semiconductor circuit according to claim 1, further comprising a detection section that detects a line break in the battery voltage signal lines, on the basis of at least one of
   (i) a comparison result outputted from the comparison section, when,
      the first connection portion is controlled to connect the first signal line with the battery voltage signal line at which the detection of the line break is being carried out,
      the second connection portion is controlled to connect the second signal line with the battery voltage signal line that is connected to the high potential side of the battery to whose low potential side the battery voltage signal line at which the detection is being carried out is connected, and
      the first voltage supply section is controlled to supply the voltage, or
   (ii) a comparison result outputted from the comparison section, when
      the first connection portion is controlled to connect the first signal line with the battery voltage signal line at which the detection of the line break is being carried out,
      the second connection portion is controlled to connect the second signal line with the battery voltage signal line that is connected to the low potential side of the battery to whose high potential side the battery voltage signal line at which the detection is being carried out is connected, and
      the second voltage supply section is controlled to supply the voltage.

6. The semiconductor circuit according to claim 2, further comprising a detection section that detects a line break in the battery voltage signal lines, on the basis of at least one of
   (i) a comparison result outputted from the comparison section, when
      the first connection portion is controlled to connect the first signal line with the battery voltage signal line at which the detection of the line break is being carried out,
      the second connection portion is controlled to connect the second signal line with the battery voltage signal line that is connected to the low potential side of the battery to whose high potential side the battery voltage signal line at which the detection is being carried out is connected, and
      the second voltage supply section is controlled to supply the voltage, or
   (ii) a comparison result outputted from the comparison section, when
      the first connection portion is controlled to connect the first signal line with the battery voltage signal line at which the detection of the line break is being carried out, the third connection portion is controlled to connect the third signal line with the battery voltage signal line that is connected to the high potential side of the battery to whose low potential side the battery voltage signal line at which the detection is being carried out is connected, and the first voltage supply section is controlled to supply the voltage.

7. The semiconductor circuit according to claim 3, further comprising a detection section that detects a line break in the battery voltage signal lines on the basis of at least one of (i) a comparison result outputted from the comparison section, when the first connection portion is controlled to connect the first signal line with the battery voltage signal line at which the detection of the line break is being carried out, the second connection portion is controlled to connect the fourth signal line with the battery voltage signal line that is connected to the low potential side of the battery to whose high potential side the battery voltage signal line at which the detection is being carried out is connected, and the second voltage supply section is controlled to supply the voltage, or (ii) a comparison result outputted from the comparison section, when the first connection portion is controlled to connect the first signal line with the battery voltage signal line at which the detection of the line break is being carried out, the third connection portion is controlled to connect the fourth signal line with the battery voltage signal line that is connected to the high potential side of the battery to whose low potential side the battery voltage signal line at which the detection is being carried out is connected, and the first voltage supply section is controlled to supply the voltage.

8. The semiconductor circuit according to claim 4, further comprising a detection section that detects a line break in the fourth signal lines, on the basis of at least one of (i) a comparison result outputted from the comparison section, when the first connection portion is controlled to connect the fourth signal line at which the detection of the line break is being carried out with the battery voltage signal line, the second connection portion is controlled to connect the second signal line with the battery voltage signal line that is connected to the low potential side of the battery to whose high potential side the battery voltage signal line connected to the fourth signal line is connected, and the second voltage supply section is controlled to supply the voltage, or (ii) a comparison result outputted from the comparison section, when the first connection portion is controlled to connect the fourth signal line at which the detection of the line break is being carried out with the battery voltage signal line, the third connection portion is controlled to connect the third signal line with the battery voltage signal line that is connected to the high potential side of the battery to whose low potential side the battery voltage signal line connected to the fourth signal line is connected, and the first voltage supply section is controlled to supply the voltage.

9. The semiconductor circuit according to claim 1, wherein the comparison section is a chopper-type comparator.

10. A semiconductor device comprising:
a plurality of batteries connected in series; and
the semiconductor circuit according to claim 1 that is connected to the plurality of batteries.

11. A line break detection method in a semiconductor circuit including, a plurality of battery voltage signal lines, each signal line connected to both ends of each of a plurality of batteries that are connected in series, provided at each battery voltage signal line, a first connection portion that connects the battery voltage signal line with a first signal line, a second connection portion that connects the battery voltage signal line with a second signal line, a first voltage supply section that supplies the battery voltage signal line with a voltage higher than a voltage at a high potential side of the battery to whose low potential side the battery voltage signal line is connected, and a second voltage supply section that supplies the battery voltage signal line with a voltage lower than a voltage at the low potential side of the battery to whose high potential side the battery voltage signal line is connected, and a comparison section that compares a voltage of the first signal line with a voltage of the second signal line and outputs a comparison result, the method comprising:

controlling the first connection portion to connect the first signal line with a battery voltage signal line among the battery voltage signal lines at which a detection of the line break is being carried out;

controlling the second connection portion to connect the second signal line with the battery voltage signal line that is connected to the high potential side of the battery to whose low potential side the battery voltage signal line at which the detection is being carried out is connected;

controlling the first voltage supply section to supply the voltage thereof;

detecting the line break in the battery voltage signal line on the basis of a comparison result outputted from the comparison section;

controlling the first connection portion to connect the first signal line with the battery voltage signal line at which the detection of the line break is being carried out;

controlling the second connection portion to connect the second signal line with the battery voltage signal line that is connected to the low potential side of the battery to whose high potential side the battery voltage signal line at which the detection is being carried out is connected;

controlling the second voltage supply section to supply the voltage thereof; and detecting the existence or non-existence of a line break in the battery voltage signal line on the basis of a comparison result outputted from the comparison section.

12. A non-transitory computer-readable medium containing computer instructions stored therein for causing a computer processor to perform a process for detecting a line break in a battery voltage signal line of a semiconductor circuit including,
- a plurality of battery voltage signal lines, each signal line connected to both ends of each of a plurality of batteries that are connected in series,
- provided at each battery voltage signal line, a first connection portion that connects the battery voltage signal line with a first signal line, a second connection portion that connects the battery voltage signal line with a second signal line, a first voltage supply section that supplies the battery voltage signal line with a voltage higher than a voltage at a high potential side of the battery to whose low potential side the battery voltage signal line is connected, and a second voltage supply section that supplies the battery voltage signal line with a voltage lower than a voltage at the low potential side of the battery to whose high potential side the battery voltage signal line is connected, and
- a comparison section that compares a voltage of the first signal line with a voltage of the second signal line and outputs a comparison result, the process comprising:
- controlling the first connection portion to connect the first signal line with a battery voltage signal line among the battery voltage signal lines at which a detection of the line break is being carried out;
- controlling the second connection portion to connect the second signal line with the battery voltage signal line that is connected to the high potential side of the battery to whose low potential side the battery voltage signal line at which the detection is being carried out is connected;
- controlling the first voltage supply section to supply the voltage thereof;
- detecting the line break in the battery voltage signal line on the basis of a comparison result outputted from the comparison section;
- controlling the first connection portion to connect the first signal line with the battery voltage signal line at which the detection of the line break is being carried out;
- controlling the second connection portion to connect the second signal line with the battery voltage signal line that is connected to the low potential side of the battery to whose high potential side the battery voltage signal line at which the detection is being carried out is connected;
- controlling the second voltage supply section to supply the voltage thereof; and
- detecting the line break in the battery voltage signal line on the basis of a comparison result outputted from the comparison section.

* * * * *